(12) United States Patent
Won et al.

(10) Patent No.: US 11,678,121 B2
(45) Date of Patent: Jun. 13, 2023

(54) DISPLAY DEVICE

(71) Applicant: Samsung Display Co. Ltd., Yongin-si (KR)

(72) Inventors: Byeong Hee Won, Incheon (KR); Jae Woo Im, Seoul (KR); Ji Yeon Seo, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 62 days.

(21) Appl. No.: 17/153,584

(22) Filed: Jan. 20, 2021

(65) Prior Publication Data

US 2021/0144480 A1    May 13, 2021

Related U.S. Application Data

(63) Continuation of application No. 16/688,730, filed on Nov. 19, 2019, now Pat. No. 10,924,860.

(30) Foreign Application Priority Data

Jan. 30, 2019  (KR) .................. 10-2019-0011741

(51) Int. Cl.
*H04R 7/04* (2006.01)
*H01L 27/32* (2006.01)
(Continued)

(52) U.S. Cl.
CPC ......... *H04R 7/045* (2013.01); *H01L 27/3225* (2013.01); *H01L 27/3276* (2013.01);
(Continued)

(58) Field of Classification Search
CPC ........ H04R 7/045; H04R 1/028; H04R 9/025; H04R 9/045; H04R 9/06; H04R 17/00;
(Continued)

(56) References Cited

U.S. PATENT DOCUMENTS

| 2004/0037441 A1 | 2/2004 | Konishi et al. |
| 2012/0162143 A1 | 6/2012 | Kai et al. |

(Continued)

FOREIGN PATENT DOCUMENTS

| CN | 102483665 | 5/2012 |
| CN | 107561753 | 1/2018 |

(Continued)

OTHER PUBLICATIONS

Extended European Search Report—European Application No. 20154224.8 dated Jun. 26, 2020, citing references listed within.

(Continued)

*Primary Examiner* — Yogeshkumar Patel
(74) *Attorney, Agent, or Firm* — Cantor Colburn LLP

(57) ABSTRACT

A display device includes: a display panel including a first substrate, a second substrate, and a light emitting element layer disposed between the first substrate and the second substrate, where the light emitting element outputs light to the second substrate; a first sound generator disposed on a surface of the first substrate, where the first sound generator vibrates the display panel to output a sound; and a first buffer member disposed on the surface of the first substrate, where a height of the first buffer member is less than a height of the first sound generator.

20 Claims, 34 Drawing Sheets

(51) Int. Cl.
| | |
|---|---|
| *H01L 51/52* | (2006.01) |
| *H04R 1/02* | (2006.01) |
| *H04R 9/02* | (2006.01) |
| *H04R 9/04* | (2006.01) |
| *H04R 9/06* | (2006.01) |
| *H04R 17/00* | (2006.01) |
| *H05K 1/14* | (2006.01) |
| *G09G 3/3208* | (2016.01) |
| *H01L 41/09* | (2006.01) |
| *H01L 41/187* | (2006.01) |
| *H01L 41/193* | (2006.01) |

(52) U.S. Cl.
CPC ........ *H01L 51/529* (2013.01); *H01L 51/5246* (2013.01); *H04R 1/028* (2013.01); *H04R 9/025* (2013.01); *H04R 9/045* (2013.01); *H04R 9/06* (2013.01); *H04R 17/00* (2013.01); *H05K 1/147* (2013.01); *G09G 3/3208* (2013.01); *G09G 2310/08* (2013.01); *H01L 41/09* (2013.01); *H01L 41/1876* (2013.01); *H01L 41/193* (2013.01); *H04R 2499/15* (2013.01); *H05K 2201/056* (2013.01); *H05K 2201/10083* (2013.01); *H05K 2201/10128* (2013.01); *H05K 2201/10356* (2013.01)

(58) Field of Classification Search
CPC ............ H04R 2499/15; H04R 2440/05; H04R 2440/07; H04R 2499/11; H04R 1/025; H04R 5/02; H04R 1/288; H04R 1/02; H04R 1/06; H04R 7/26; H01L 27/3225; H01L 27/3276; H01L 51/5246; H01L 51/529; H01L 41/09; H01L 41/1876; H01L 41/193; H05K 1/147; H05K 2201/056; H05K 2201/10083; H05K 2201/10128; H05K 2201/10356; H05K 5/03; H05K 7/20963; G09G 3/3208; G09G 2310/08; G09F 9/30
See application file for complete search history.

(56) References Cited

U.S. PATENT DOCUMENTS

| | | | |
|---|---|---|---|
| 2018/0053813 A1* | 2/2018 | Choi | ...................... H04R 9/025 |
| 2018/0317000 A1 | 11/2018 | Ham et al. | |
| 2019/0014402 A1 | 1/2019 | Ahn et al. | |
| 2019/0037164 A1* | 1/2019 | Kim | ........................ H04R 1/026 |
| 2019/0045287 A1 | 2/2019 | Lee et al. | |

FOREIGN PATENT DOCUMENTS

| | | |
|---|---|---|
| CN | 108124218 | 6/2018 |
| CN | 109218930 | 1/2019 |
| EP | 3330780 | 6/2018 |
| EP | 3439317 | 2/2019 |
| KR | 20030048076 | 6/2003 |
| KR | 1020060006630 | 1/2006 |
| KR | 1020080063700 | 7/2008 |
| KR | 1020120081791 | 7/2012 |
| KR | 101919454 | 11/2018 |

OTHER PUBLICATIONS

European Office Action—European Application No. 20154224.8 dated Feb. 14, 2022, citing references listed within.

\* cited by examiner

DISPLAY DEVICE

This application is a continuation of U.S. patent application Ser. No. 16/688,730, filed on Nov. 19, 2019, which claims priority to Korean Patent Application No. 10-2019-0011741, filed on Jan. 30, 2019, and all the benefits accruing therefrom under 35 U.S.C. § 119, the content of which in its entirety is herein incorporated by reference.

BACKGROUND

1. Field

The disclosure relates to a display device.

2. Description of the Related Art

As the information society develops, the demand for display devices for displaying images is increasing in various forms. For example, display devices are being applied to various electronic devices such as smartphones, digital cameras, notebook computers, navigation devices, and smart televisions. The display devices may be flat panel display devices such as liquid crystal display devices, field emission display devices, and organic light emitting display devices.

SUMMARY

A display device may include a display panel for displaying an image and a speaker for providing sound. Conventionally, due to space limitations of the display device, the speaker may be disposed on a lower surface or a side of a display panel. In this case, although it is desirable for sound output from the speaker to be output from the front of the display device, the sound is output from the back of the display device or from a side of the display device. Therefore, sound quality may be reduced.

Embodiments of the disclosure provide a display device with improved sound quality by outputting a sound from the front of the display device by vibrating a display panel using a sound generator.

Embodiments of the disclosure also provide a display device in which a display panel is prevented from being damaged when the display panel vibrates.

According to an embodiment of the disclosure, a display device includes: a display panel including a first substrate, a second substrate, and a light emitting element layer disposed between the first substrate and the second substrate, where the light emitting element layer outputs light to the second substrate; a first sound generator disposed on a surface of the first substrate, where the first sound generator vibrates the display panel to output a sound; and a first buffer member disposed on the surface of the first substrate, where a height of the first buffer member is less than a height of the first sound generator.

In an embodiment, the display device may further include: a lower cover disposed on the surface of the first substrate; and a circuit board disposed on a first surface of the lower cover.

In an embodiment, the first substrate and the first buffer member may be spaced apart from each other with a gap therebetween.

In an embodiment, the height of the first buffer member may be less than a distance between the surface of the first substrate and a second surface of the lower cover, which is opposite to the first surface.

In an embodiment, the first buffer member may comprise: a first base film; a first buffer layer disposed on a surface of the first base film; an adhesive layer disposed on the first buffer layer; and a first sacrificial layer disposed between the first buffer layer and the adhesive layer.

In an embodiment, the adhesive layer may be attached to the lower cover or the circuit board.

In an embodiment, the first buffer member may be attached to the second surface of the lower cover which faces the surface of the first substrate.

In an embodiment, the gap between the first substrate and the first buffer member may be less than a gap between the first substrate and the lower cover.

In an embodiment, the display device may further include a blocking member disposed between the first substrate and the lower cover.

In an embodiment, the first buffer member may be attached to a surface of the circuit board which faces the surface of the first substrate.

In an embodiment, the height of the first buffer member may be less than a distance between the surface of the first substrate and the surface of the circuit board.

In an embodiment, the display device may further include a blocking member disposed between the first substrate and the circuit board.

In an embodiment, a height of the blocking member may be greater than the height of the first buffer member.

In an embodiment, the blocking member may include: a second base film; a second buffer layer disposed on a surface of the second base film; a first adhesive layer disposed on the second buffer layer; a second adhesive layer disposed on another surface of the second base film; and a second sacrificial layer disposed between the second buffer layer and the first adhesive layer.

In an embodiment, the display device may further include a heat dissipation film attached onto the surface of the first substrate, where the first adhesive layer may be attached to the heat dissipation film, and the second adhesive layer may be attached to the lower cover or the circuit board.

In an embodiment, the display device may further include a timing control circuit disposed on the circuit board, where the timing control circuit controls driving timing of the display panel.

In an embodiment, the display device may further include a sound driving circuit disposed on the circuit board, where the sound driving circuit outputs a first sound signal to the first sound generator.

In an embodiment, the display device may further include a fixing member which fixes the circuit board to the lower cover, where the fixing member includes a protrusion which is disposed through the lower cover and the circuit board and protrudes from the second surface of the lower cover, where the protrusion is inserted into the first buffer member.

In an embodiment, the first sound generator may comprise: a bobbin disposed on the surface of the first substrate; a voice coil which surrounds the bobbin; a magnet disposed on the bobbin and spaced apart from the bobbin; and a lower plate disposed on the magnet and fixed to the lower cover or the circuit board by a fixing member.

In an embodiment, the display device may further include: a third sound generator disposed on the surface of the first substrate; and a sound circuit board electrically connected to the third sound generator to transmit a sound signal to the third sound generator.

In an embodiment, the third sound generator may include: a first electrode which receives a first driving voltage; a second electrode which receives a second driving voltage;

and a vibration layer disposed between the first electrode and the second electrode, where the vibration layer includes a piezoelectric element which contracts or expands in response to the first driving voltage applied to the first electrode and the second driving voltage applied to the second electrode.

In an embodiment, the display device may further include: flexible films connected to the first substrate of the display panel; a source circuit board connected to the flexible films; and a cable which connects the circuit board and the source circuit board to each other.

In an embodiment, a first hole may be defined through the lower cover, and the cable may be disposed through the first hole.

In an embodiment, the source circuit board may be disposed on the surface of the first substrate, and the circuit board may be disposed on the first surface of the lower cover.

In an embodiment, a second hole may be defined through the lower cover, and the sound circuit board may be disposed through the second hole.

In an embodiment, the source circuit board and the circuit board may be disposed on the first surface of the lower cover.

In an embodiment, the display device may further include a second buffer member which overlaps the third sound generator, where the second buffer member and the third sound generator are spaced apart from each other with a gap therebetween.

In an embodiment, the display device may further include a second buffer member disposed on the third sound generator, where the second buffer member and the lower cover are spaced apart from each other with a gap therebetween.

According to another embodiment of the disclosure a display device includes: a display panel including a first substrate; a lower cover disposed on a surface of the first substrate; a first sound generator disposed on the surface of the first substrate, where the first sound generator vibrates the display panel to output a sound; and a first buffer member disposed on the surface of the first substrate, where a height of the first buffer member is equal to or less than a distance between the first substrate and the lower cover.

BRIEF DESCRIPTION OF THE DRAWINGS

These and/or other embodiments will become apparent and more readily appreciated from the following description of the embodiments, taken in conjunction with the accompanying drawings, in which.

DETAILED DESCRIPTION

Figure 1:
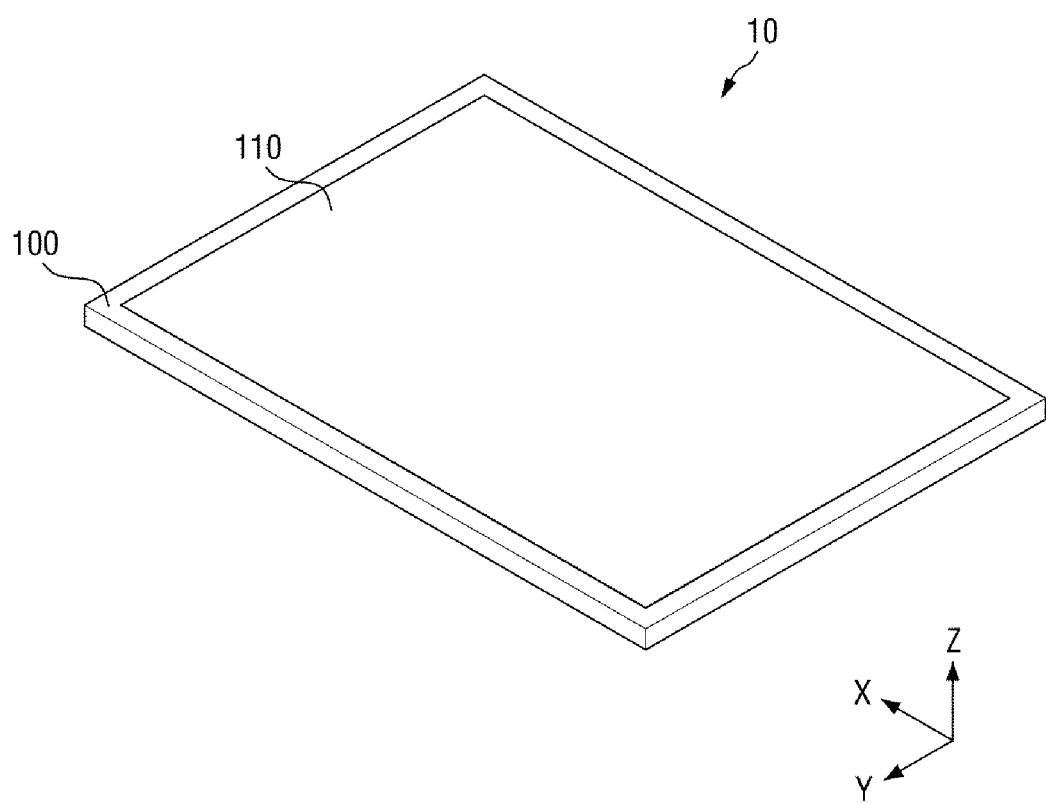
FIG. 1 is a perspective view of a display device according to an embodiment.

The invention now will be described more fully hereinafter with reference to the accompanying drawings, in which various embodiments are shown. This invention may, however, be embodied in many different forms, and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will also be understood that when a layer is referred to as being "on" another layer or substrate, it can be directly on the other layer or substrate, or intervening layers may also be present. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, "a first element," "component," "region," "layer" or "section" discussed below could be termed a second element, component, region, layer or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "Or" means "and/or," "At least one of A and B" means "A and/or B." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Furthermore, relative terms, such as "lower" or "bottom" and "upper" or "top," may be used herein to describe one element's relationship to another elements as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper" depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system).

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

Hereinafter, embodiments of the invention will be described in detail with reference to the accompanying drawings.

For convenience of description, embodiments where a display device 10 is an organic light emitting display device using organic light emitting elements as light emitting elements, but the disclosure is not limited thereto. Alternatively, the display device 10 may be an inorganic light emitting display device using micro-light emitting diodes or inorganic semiconductors (inorganic light emitting diodes) as light emitting elements.

Figure 2:
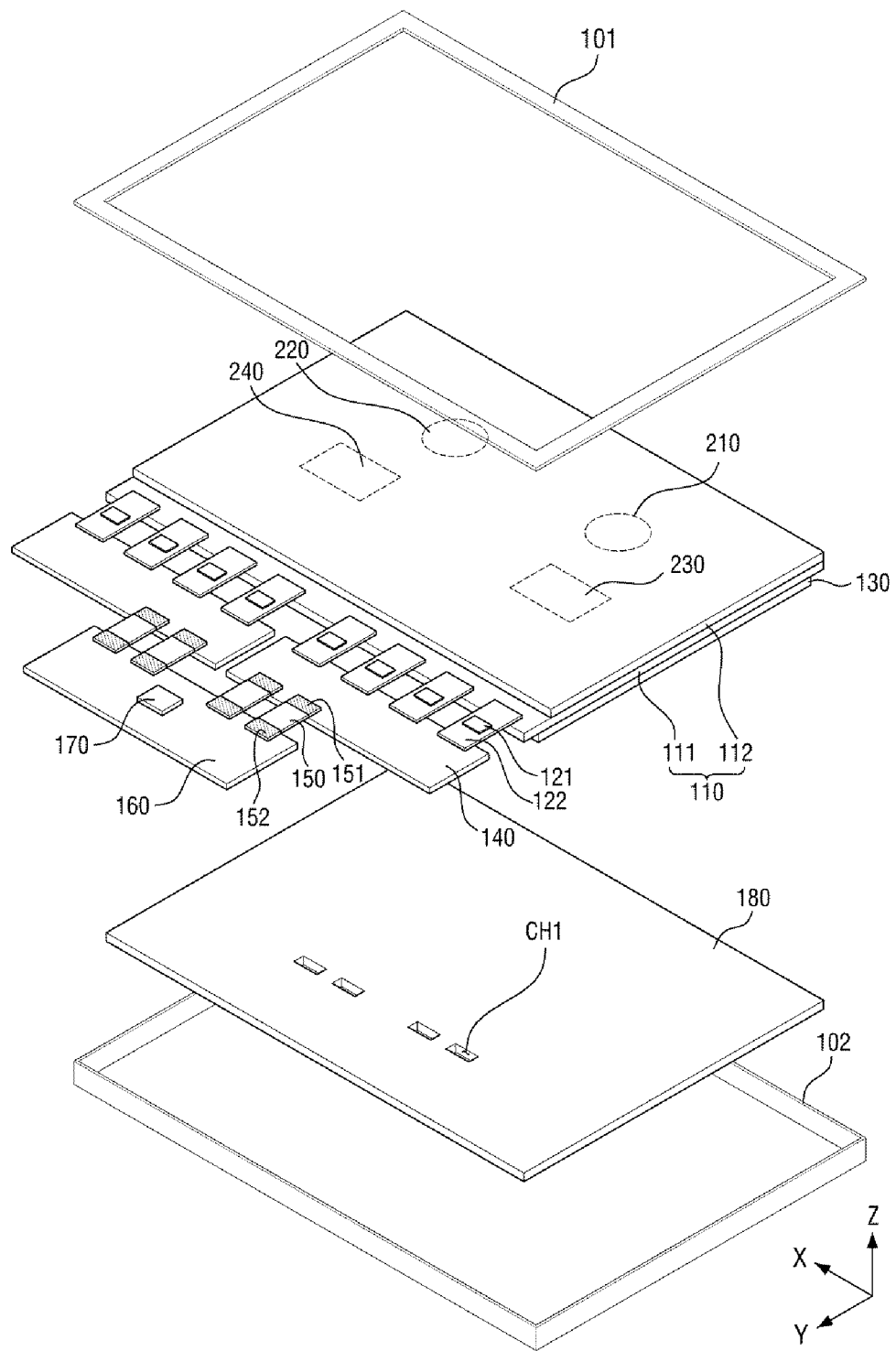
FIG. 2 is an exploded perspective view of the display device according to the embodiment.

FIG. 1 is a perspective view of a display device 10 according to an embodiment. FIG. 2 is an exploded perspective view of the display device 10 according to an embodiment.

Referring to FIGS. 1 and 2, an embodiment of the display device 10 includes a set cover 100, a display panel 110, source driving circuits 121, flexible films 122, a heat dissipation film 130, source circuit boards 140, cables 150, a control circuit board 160, a timing control circuit 170, and a lower cover 180.

In the specification, the terms "upper", "top" and "upper surface" indicate a direction in which a second substrate 112 is disposed with respect to a first substrate 111 of the display panel 110, that is, a Z-axis direction, and the terms "lower," "bottom" and "lower surface" indicate a direction in which the heat dissipation film 130 is disposed with respect to the first substrate 111 of the display panel 110, that is, a direction opposite to the Z-axis direction. In addition, "left," "right," "up" and "down" indicate directions when the display panel 110 is viewed in a plane. For example, "left" indicates an X-axis direction, "right" indicates a direction opposite to the X-axis direction, "up" indicates a Y-axis direction, and "down" indicates a direction opposite to the Y-axis direction.

The set cover 100 may surround or cover edges of the display panel 110. The set cover 100 may cover a non-display area excluding a display area of the display panel 110. In an embodiment, the set cover 100 may include an upper set cover 101 and a lower set cover 102 as illustrated in FIG. 2. The upper set cover 101 may cover edge portions of an upper surface of the display panel 110, and the lower set cover 102 may cover lower and side surfaces of the display panel 110. The upper set cover 101 and the lower set cover 102 may be coupled to each other by a fixing member such as a screw or an adhesive member such as a double-sided tape or an adhesive. The upper set cover 101 and the lower set cover 102 may include or be made of a plastic, a metal or a combination thereof. The display panel 110 may be rectangular in a plan view. In one embodiment, for example, the display panel 110 may have a rectangular planar shape having long sides in a first direction (X-axis direction) and short sides in a second direction (Y-axis direction) as illustrated in FIG. 2. Each corner where a long side extending in the first direction (X-axis direction) meets a short side extending in the second direction (Y-axis direction) may be right-angled or may be rounded with a predetermined curvature. The planar shape of the display panel 110 is not limited to the rectangular shape, but may also be variously modified to have another polygonal shape, a circular shape or an elliptical shape.

In FIG. 2, the display panel 110 is flat. However, the disclosure is not limited to this case. The display panel 110 may also be curved or bent with a predetermined curvature.

The display panel 110 may include the first substrate 111 and the second substrate 112. The first substrate 111 and the second substrate 112 may be rigid or flexible. The first substrate 111 may include or be made of a glass or a plastic, and the second substrate 112 may include or be made of glass, plastic, an encapsulation film, or a barrier film. The plastic may be polyethersulphone ("PES"), polyacrylate ("PA"), polyarylate ("PAR"), polyetherimide ("PEI"), polyethylene naphthalate ("PEN"), polyethylene terephtalate ("PET"), polyphenylene sulfide ("PPS"), polyallylate, polyimide ("PI"), polycarbonate ("PC"), cellulose triacetate ("CAT"), cellulose acetate propionate ("CAP"), or a combination thereof. The encapsulation film or the barrier film may be a film in which a plurality of inorganic layers are stacked one on another.

Figure 7:
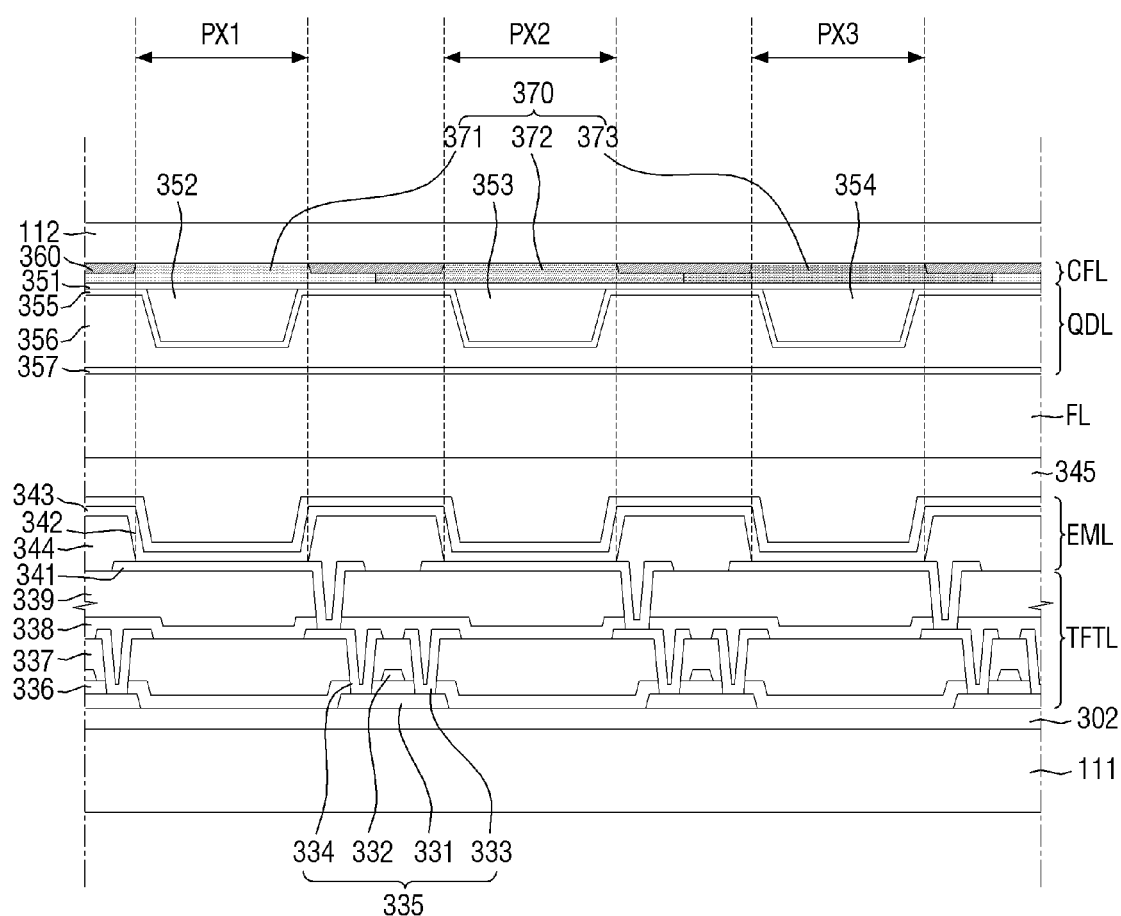
FIG. 7 is a cross-sectional view of an embodiment of a display area of a display panel.

In an embodiment, the display panel 110 may include a thin-film transistor layer TFTL, a light emitting element layer EML, a filler FL, a light wavelength conversion layer QDL, and a color filter layer CFL as illustrated in FIG. 7. In such an embodiment, the first substrate 111 may be a thin-film transistor substrate on which the thin-film transistor layer TFTL, the light emitting element layer EML and a thin-film encapsulation layer 345 are disposed, the second substrate 112 may be a color filter substrate on which the wavelength conversion layer QDL and the color filter layer CFL are disposed, and the filler FL may be disposed between the thin-film encapsulation layer 345 on the first substrate 111 and the wavelength conversion layer QDL on the second substrate 112. The thin-film transistor layer TFTL, the light emitting element layer EML, the filler FL, the wavelength conversion layer QDL and the color filter layer CFL of the display panel 110 (collectively shown as a layer 113 in FIG. 5) will be described in detail later with reference to FIG. 7.

In such an embodiment, an additional film 114 (shown in FIG. 5) may be disposed on the second substrate 112. In one embodiment, for example, the additional film 114 may be an antireflective film.

A side of each of the flexible films 122 may be attached onto a surface of an element on the first substrate 111 of the display panel 110, and the other side of each of the flexible films 122 may be attached onto a surface of one of the source circuit boards 140. In an embodiment, since the first substrate 111 is larger in size than the second substrate 112, a side of an element on the first substrate 111 may be exposed without being covered by the second substrate 112. The flexible films 122 may be attached to the exposed side of an element on the first substrate 111 which is not covered by the second substrate 112. Each of the flexible films 122 may be attached onto the surface of the first substrate 111 and the surface of one of the source circuit boards 140 by using an anisotropic conductive film.

Figure 4:
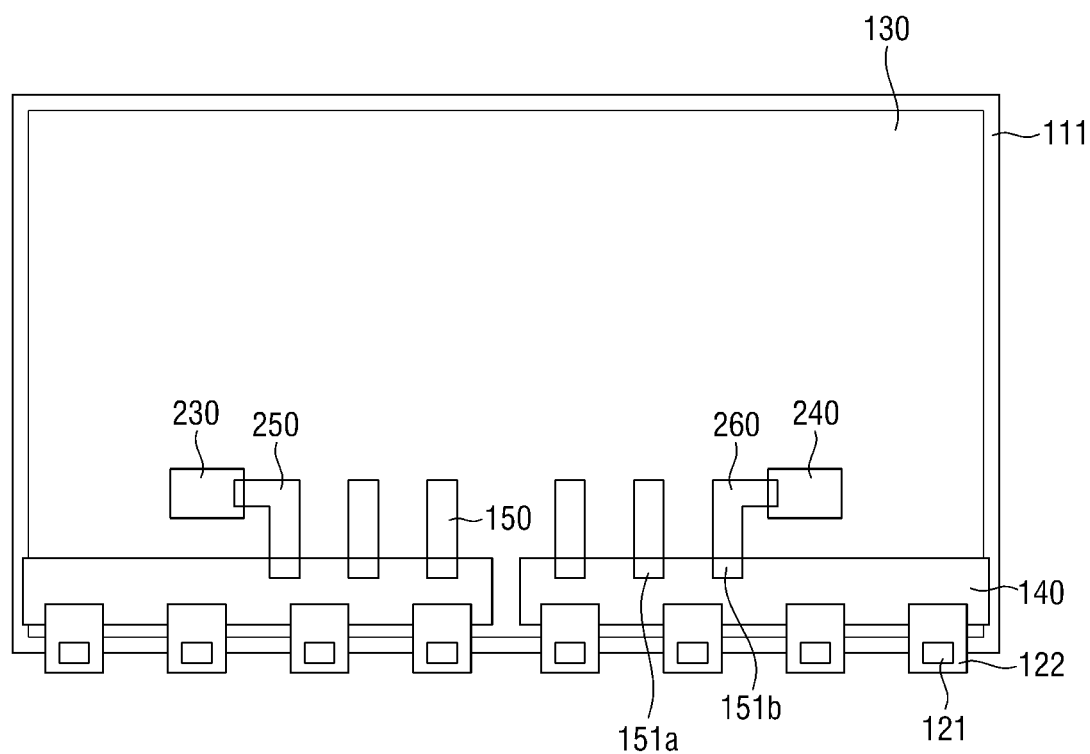
FIG. 4 is a bottom view of an embodiment of the display device when a lower cover and a control circuit board are omitted from FIG. 3.
Figure 4:
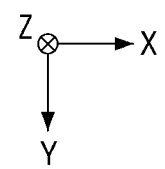
Figure 6:
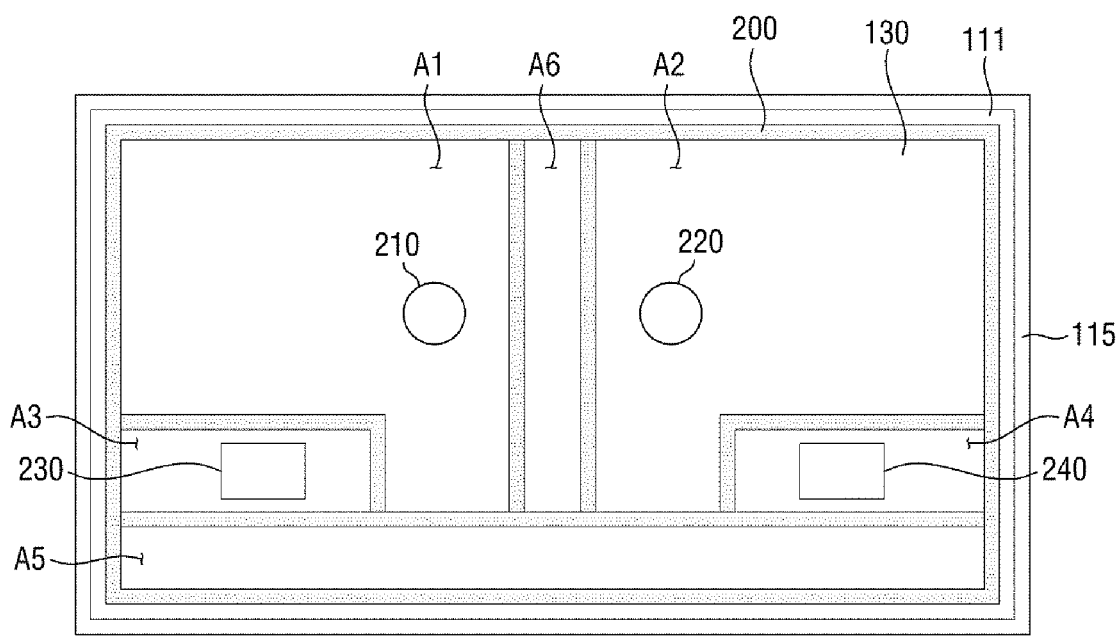
FIG. 6 is a bottom view of a heat dissipation film, an adhesive member, a blocking member and first through fourth sound generators of the display device.
Figure 6:
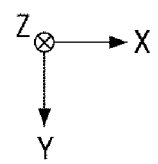

Each of the flexible films 122 may be a tape carrier package or a chip on film. Each of the flexible films 122 is bendable. Therefore, the flexible films 122 may be bent toward a lower surface of the first substrate 111 as illustrated in FIGS. 4 and 6. In such an embodiment, the source circuit boards 140, the cables 150, and the control circuit board 160 may be disposed on the lower surface of the first substrate 111.

In an embodiment shown in FIG. 2, eight flexible films 122 are on the first substrate 111 of the display panel 110, but the number of the flexible films 122 is not limited thereto.

The source driving circuits 121 may be disposed or mounted on surfaces of the flexible films 122, respectively. The source driving circuits 121 may be defined by or formed as integrated circuits. The source driving circuits 121 convert digital video data into analog data voltages based on a source control signal of the timing control circuit 170 and supply the analog data voltages to data lines of the display panel 110 through the flexible films 122.

Each of the source circuit boards 140 may be connected to the control circuit board 160 via the cables 150. In such an embodiment, each of the source circuit boards 140 may include first connectors 151a for connection to the cables 150. The source circuit boards 140 may be flexible printed circuit boards or printed circuit boards. The cables 150 may be flexible cables.

The control circuit board 160 may be connected to the source circuit boards 140 via the cables 150. In an embodiment, the source circuit boards 140 may include first connectors 151 for connection to the cables 150, and the control circuit board 160 may include second connectors 152 for connection to the cables 150. The control circuit board 160 may be a flexible printed circuit board or a printed circuit board.

In an embodiment of FIG. 2, four cables 150 connect the source circuit boards 140 and the control circuit board 160, but the number of the cables 150 is not limited thereto. In FIG. 2, two source circuit boards 140 are illustrated, but the number of the source circuit boards 140 is not limited thereto.

The timing control circuit 170 may be disposed or mounted on a first surface of the control circuit board 160. The timing control circuit 170 may be defined by or formed as an integrated circuit. The timing control circuit 170 may receive digital video data and timing signals from a system on chip of a system circuit board and generate a source control signal for controlling the timings of the source driving circuits 121 based on the timing signals.

The system on chip may be disposed or mounted on the system circuit board connected to the control circuit board 160 via another flexible cable and may be defined by or formed as an integrated circuit. The system on chip may be a processor of a smart television, a central processing unit ("CPU") or graphics card of a computer or notebook, or an application processor of a smartphone or tablet personal computer ("PC"). The system circuit board may be a flexible printed circuit board or a printed circuit board.

A power supply circuit (not shown) may be additionally attached onto the first surface of the control circuit board 160. The power supply circuit may generate voltages used for driving the display panel 110 from main power received from the system circuit board and supply the generated voltages to the display panel 110. In one embodiment, for example, the power supply circuit may generate a high-potential voltage, a low-potential voltage and an initialization voltage for driving organic light emitting elements and supply the generated voltages to the display panel 110. In such an embodiment, the power supply circuit may generate driving voltages for driving the source driving circuits 121, the timing control circuit 170, etc. and supply the generated voltages. The power supply circuit may be defined by or formed as an integrated circuit. Alternatively, the power supply circuit may be disposed on a power circuit board formed separately from the control circuit board 160. The power circuit board may be a flexible printed circuit board or a printed circuit board.

In an embodiment, the heat dissipation film 130 may be disposed on a surface of the first substrate 111 which does not face the second substrate 112, that is, on the lower surface of the first substrate 111. In such an embodiment, first through fourth sound generators 210 through 240 may be disposed on a surface of the heat dissipation film 130 which does not face the first substrate 111, that is, on a lower surface of the heat dissipation film 130. The heat dissipation film 130 dissipates heat generated by the first through fourth sound generators 210 through 240. In such an embodiment, the heat dissipation film 130 may include a layer including a material having high thermal conductivity, such as graphite, silver (Ag), copper (Cu) or aluminum (Al).

In an embodiment, the heat dissipation film 130 may include a plurality of graphite layers or a plurality of metal layers formed in the first direction (X-axis direction) and the second direction (Y-direction), not in a third direction (Z-direction). In such an embodiment, since the heat generated by the first through fourth sound generators 210 through 240 is allowed to be diffused in the first direction (X-axis direction) and the second direction (Y-axis direction), the heat may be released more effectively. Herein, the first direction (X-axis direction) may be a width direction (or a horizontal direction) of the display panel 110, the second direction (Y-axis direction) may be a length direction (or a vertical direction) of the display panel 110, and the third direction (Z-axis direction) may be a thickness direction of the display panel 110. Therefore, the heat dissipation film 130 may minimize the effect of the heat generated by the first through fourth sound generators 210 through 240 on the display panel 110.

Figure 5:
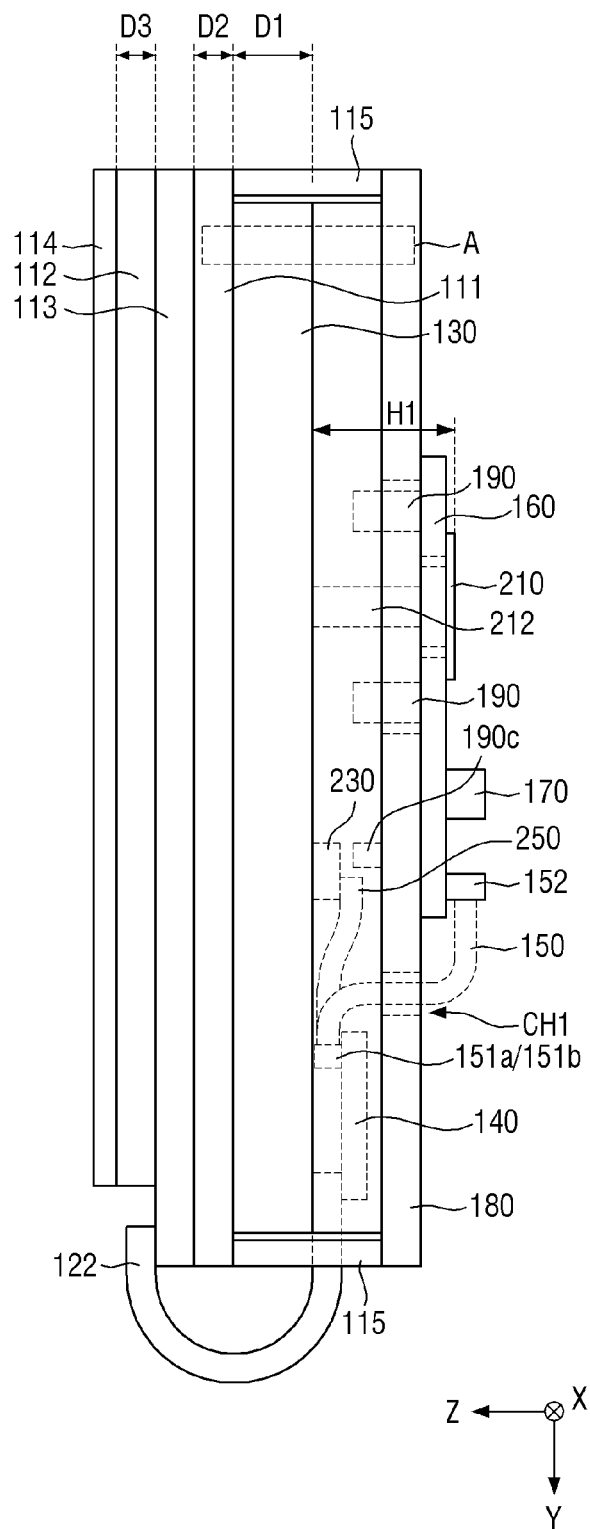
FIG. 5 is a side view of an embodiment of the display device of FIG. 2.

In an embodiment, as shown FIG. 5, a thickness D1 of the heat dissipation film 130 may be greater than a thickness D2 of the first substrate 111 and a thickness D3 of the second substrate 112 to effectively prevent the heat generated by the first through fourth sound generators 210 through 240 from affecting the display panel 110.

The size of the heat dissipation film 130 may be smaller than that of the first substrate 111. Therefore, an edge of the surface of the first substrate 111 may be exposed without being covered by the heat dissipation film 130.

In an alternative embodiment, the heat dissipation film 130 may be omitted, and in such an embodiment, elements disposed on the surface of the heat dissipation film 130 can be understood as being disposed on the surface of the first substrate 111.

The first through fourth sound generators 210 through 240 may be vibration devices capable of vibrating the display panel 110 in the third direction (Z-axis direction). In such an embodiment, the display panel 110 may serve as a diaphragm for outputting sound.

Figure 8:
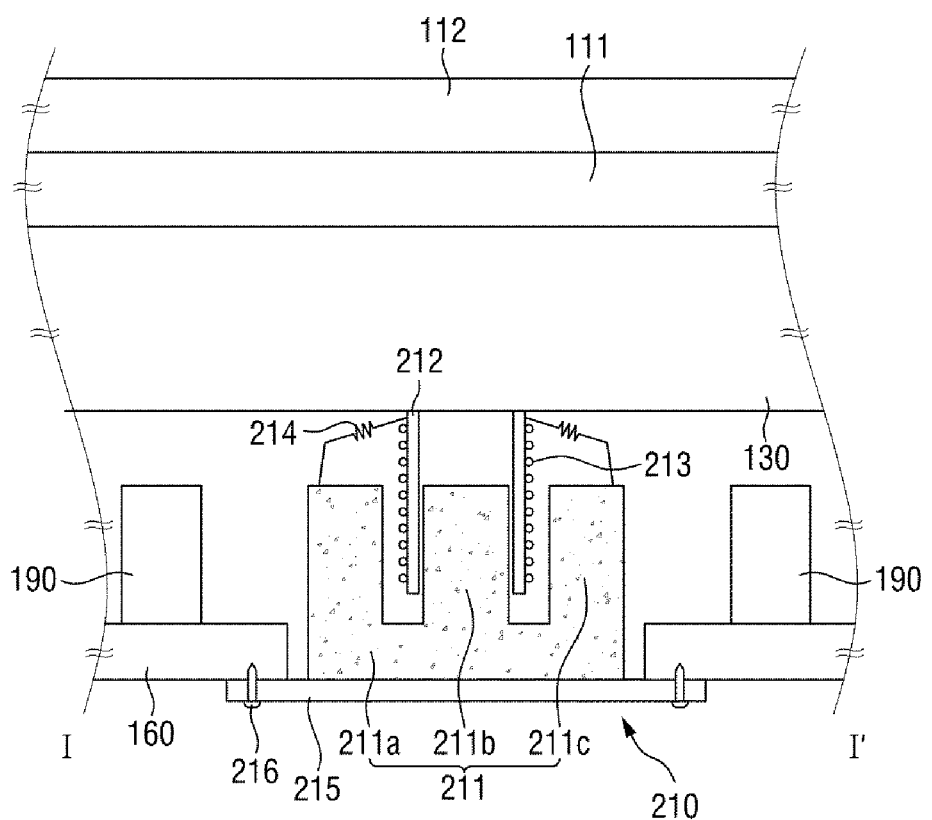
FIG. 8 is a cross-sectional view of an embodiment of the first sound generator and the second sound generator of FIG. 3.
Figure 10A:
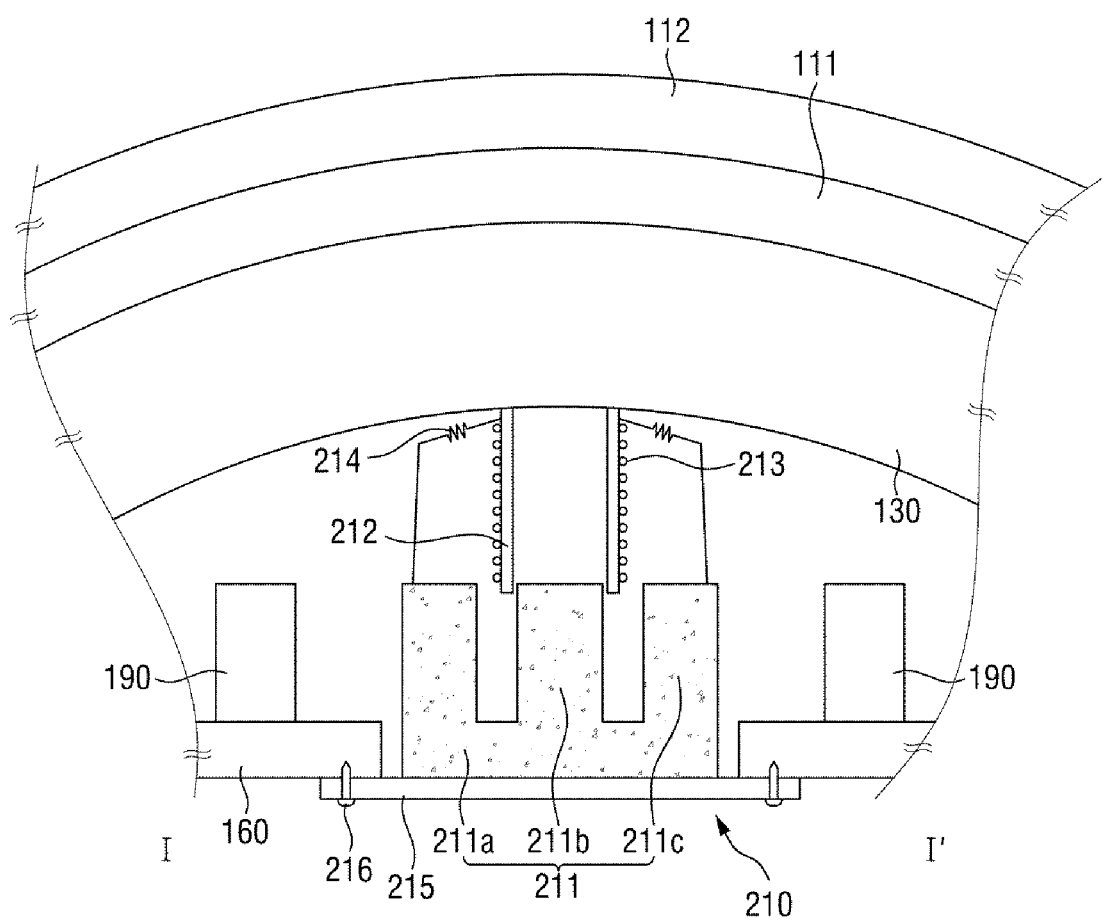
FIGS. 10A and 10B illustrate a vibration of the display panel by the first sound generator of FIG. 8.
Figure 10B:
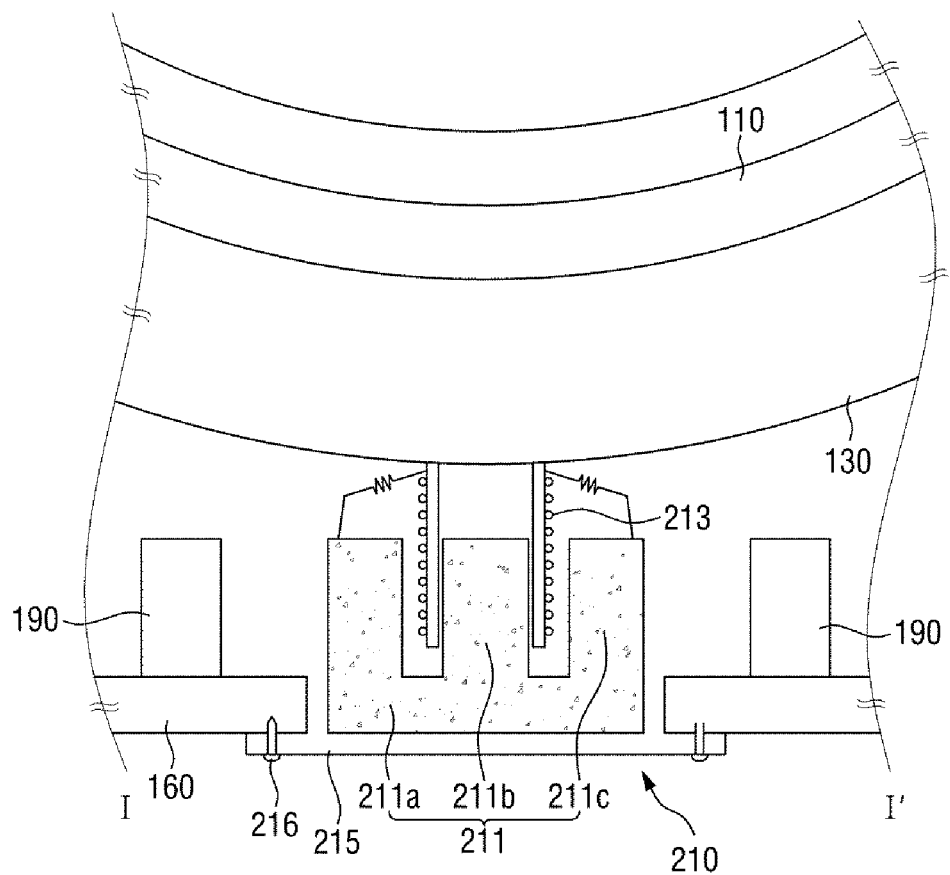

In an embodiment, each of the first sound generator 210 and the second sound generator 220 may be an exciter that vibrates the display panel 110 by generating a magnetic force using a voice coil as illustrated in FIGS. 8, 10A and 10B. In such an embodiment, each of the third sound generator 230 and the fourth sound generator 240 may be a piezoelectric element that vibrates the display panel 110 by contracting or expanding in response to an applied voltage as illustrated in FIGS. 12, 13, 14, 15A and 15B.

In an embodiment, the first sound generator 210 and the second sound generator 220 may serve as mid- and low-sound generators that output sound in mid and low bands, and the third sound generator 230 and the fourth sound generator 240 may serve as high-sound generators that output sound in a high band higher than that of the sound output by the first sound generator 210 and the second sound generator 220. In such an embodiment, the display device 10 may provide right stereo sound using the first sound generator 210 and the third sound generator 230 and provide left stereo sound using the second sound generator 220 and the fourth sound generator 240. Therefore, the display device 10 may provide 2.0 channel stereo sound.

Alternatively, the third sound generator 230 and the fourth sound generator 240 may be omitted, and the first sound generator 210 and the second sound generator 220 may respectively serve or function as mid- and high-sound generators that output sound in mid and high bands. In such an embodiment, the display device 10 may provide right stereo sound using the first sound generator 210 and provide left stereo sound using the second sound generator 220. Therefore, the display device 10 may provide 2.0 channel stereo sound.

Alternatively, the second sound generator 220 may be omitted, the first sound generator 210 may serve as a low-sound generator that outputs sound in a low band, and the third sound generator 230 and the fourth sound generator 240 may serve as high-sound generators that output sound in a high band higher than that of the sound output by the first sound generator 210. In such an embodiment, the display device 10 may provide low-pitched sound using the first sound generator 210, provide right stereo sound using the third sound generator 230 and provide left stereo sound using the fourth sound generator 240. Therefore, the display device 10 may provide 2.1 channel stereo sound.

Alternatively, the second sound generator 220, the third sound generator 230 and the fourth sound generator 240 may be omitted, and the first sound generator 210 may serve as a mid- and high-sound generator that outputs sound in mid and high bands. In such an embodiment, the display device 10 may provide mid- and high-pitched sound using the first sound generator 210. Therefore, the display device 10 may provide monaural sound.

In an embodiment, the display device 10 includes four sound generators 210 through 240 as shown in FIG. 2, but the number of the sound generators 210 through 240 is not limited thereto. The first sound generator 210 and the second sound generator 220 will be described in detail later with reference to FIGS. 8, 10A and 10B. The third sound generator 230 and the fourth sound generator 240 will be described in detail later with reference to FIGS. 12, 13, 14, 15A and 15B.

The lower cover 180 may be disposed on the surface of the heat dissipation film 130. The lower cover 180 may be attached to the edges of the surface of the first substrate 111 of the display panel 110 with a first adhesive member 115. The first adhesive member 115 may be a double-sided tape including a buffer layer such as foam. The lower cover 180 may be metal or tempered glass.

In an embodiment, as described above, the display device 10 outputs sound using the display panel 110 as a diaphragm through the first through fourth sound generators 210 through 240. In such an embodiment, since sound ay be output from the front of the display device 10, sound quality may be improved. In such an embodiment, the first through fourth sound generators 210 through 240 allow a speaker typically provided on a lower surface or a side of a conventional display panel to be omitted.

In an embodiment, the display device 10 may be a medium- and large-sized display device including a plurality of source driving circuits 121 in FIGS. 1 and 2, but the disclosure is not limited thereto. Alternatively, the display device may also be a small-sized display device including a single source driving circuit 121. In such an embodiment, the flexible films 122, the source circuit boards 140, and the cables 150 may be omitted. In such an embodiment, the source driving circuits 121 and the timing control circuit 170 may be integrated into a single integrated circuit and then attached onto a single flexible circuit board or disposed on the first substrate 111 of the display panel 110. Herein, the medium- and large-sized display device include monitors and televisions, for example, and the small-sized display device include smartphones and tablet PCs, for example.

Figure 3:
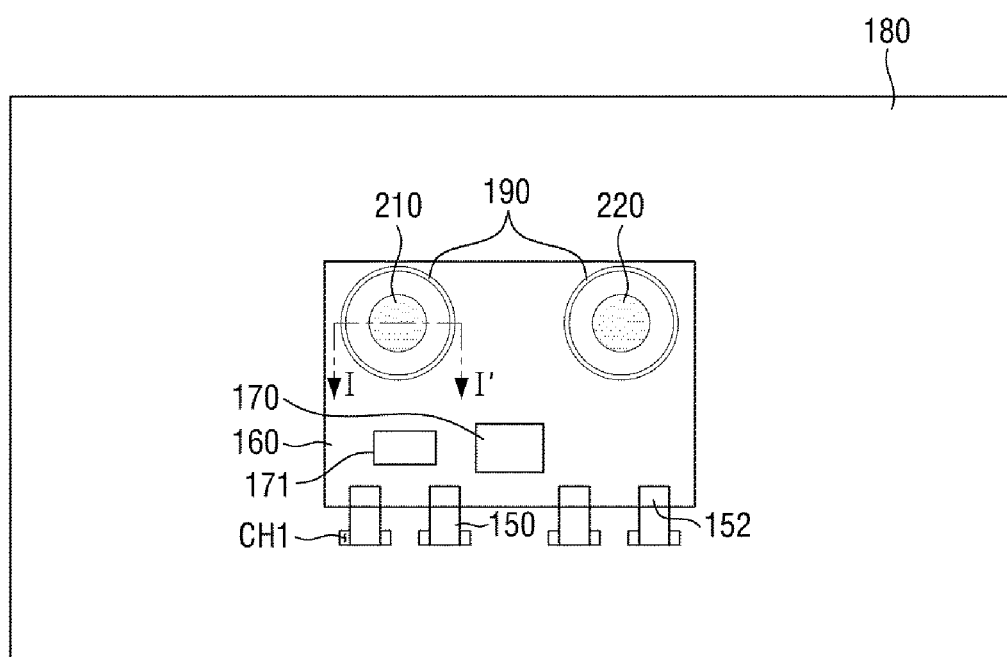
FIG. 3 is a bottom view of an embodiment of the display device according to the embodiment.
Figure 3:
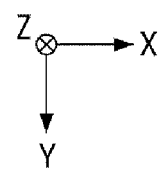

FIG. 3 is a bottom view of an embodiment of the display device 10 of FIG. 2. FIG. 4 is a bottom view of an embodiment of the display device 10 when the lower cover 180 and the control circuit board 160 are omitted from FIG. 3. FIG. 5 is a side view of an embodiment of the display device 10 of FIG. 2.

Referring to FIGS. 3 through 5, in an embodiment of the display device 10, the flexible films 122 may be bent toward the lower surface of the heat dissipation film 130. Therefore, the source circuit boards 140 may be disposed on the surface of the heat dissipation film 130.

In such an embodiment, where the source circuit boards 140 are disposed on the surface of the heat dissipation film 130, the control circuit board 160 is disposed on a first surface of the lower cover 180. In such an embodiment, the source circuit boards 140 are disposed between the surface of the heat dissipation film 130 and a second surface of the lower cover 180. Therefore, the cables 150 connected to the first connectors 151*a* of the source circuit boards 140 may be connected to the second connectors 152 of the control circuit board 160 through first cable holes CH1 defined through the lower cover 180.

The third sound generator 230 and the fourth sound generator 240 may be attached onto the surface of the heat dissipation film 130 with an adhesive member such as a double-sided adhesive. The third sound generator 230 may be connected to a second connector 151*b* of a source circuit board 140 by a first sound circuit board 250, and the fourth sound generator 240 may be connected to a second connector 151*b* of a source circuit board 140 by a second sound circuit board 260. A first pad and a second pad, which are connected to a first electrode and a second electrode disposed on a surface of the third sound generator 230, may be disposed on a side of the first sound circuit board 250. A first pad and a second pad, which are connected to a first electrode and a second electrode disposed on a surface of the fourth sound generator 240, may be disposed on a side of the second sound circuit board 260. Connection portions for connection to the second connectors 151*b* of the source circuit boards 140 may be disposed on the other side of the first sound circuit board 250 and the other side of the second sound circuit board 260. That is, the third sound generator 230 may be electrically connected to the source circuit board 140 by the first sound circuit board 250, and the fourth sound generator 240 may be electrically connected to the source circuit board 140 by the second sound circuit board 260. The first sound circuit board 250 and the second sound circuit board 260 may be flexible printed circuit boards or flexible cables.

A sound driving circuit 171, the first sound generator 210, and the second sound generator 220 as well as the timing control circuit 170 may be disposed on the control circuit board 160.

The sound driving circuit 171 may receive a sound control signal, which is a digital signal, from the system circuit board. The sound driving circuit 171 may be defined by or formed as an integrated circuit and may be disposed on the control circuit board 160 or the system circuit board. The sound driving circuit 171 may include a digital signal processor ("DSP") for processing a sound control signal which is a digital signal, a digital-to-analog converter ("DAC") for converting the digital signal processed by the DSP into driving voltages which are analog signals, and an amplifier ("AMP") for amplifying the analog driving voltages output from the DAC and outputting the amplified analog driving voltages. The analog driving voltages may include a positive driving voltage and a negative driving voltage.

In an embodiment, the sound driving circuit 171 may generate a first sound signal including a first driving voltage (hereinafter, $(1A)^{th}$ driving voltage) and a second first driving voltage (hereinafter, $(1B)^{th}$ driving voltage) for driving the first sound generator 210, and a second sound signal including a first second driving voltage (hereinafter, $(2A)^{th}$ driving voltage) and a second second driving voltage (hereinafter $(2B)^{th}$ driving voltage) for driving the second sound generator 220 in response to a sound control signal. In such an embodiment, the sound driving circuit 171 may generate a third sound signal including a first third driving voltage (hereinafter $(3A)^{th}$ driving voltage) and a second third driving voltage (hereinafter, $(3B)^{th}$ driving voltage) for driving the third sound generator 230, and a fourth sound signal including a first fourth driving voltage (hereinafter, $(4A)^{th}$ driving voltage) and a second fourth driving voltage (hereinafter, $(4B)^{th}$ driving voltage) for driving the fourth sound generator 240 in response to the sound control signal.

The first sound generator 210 may receive the first sound signal including the $(1A)^{th}$ driving voltage and the $(1B)^{th}$ driving voltage from the sound driving circuit 171. The first sound generator 210 may output sound by vibrating the display panel 110 based on the $(1A)^{th}$ driving voltage and the $(1B)^{th}$ driving voltage.

The second sound generator 220 may receive the second sound signal including the $(2A)^{th}$ driving voltage and the $(2B)^{th}$ driving voltage from the sound driving circuit 171. The second sound generator 220 may output sound by vibrating the display panel 110 based on the $(2A)^{th}$ driving voltage and the $(2B)^{th}$ driving voltage.

In an embodiment, where the sound driving circuit 171, the first sound generator 210 and the second sound generator 220 are disposed on the control circuit board 160 as illustrated in FIG. 3, the sound driving circuit 171 and the first sound generator 210 may be electrically connected to each other by metal lines of the control circuit board 160. In such an embodiment, the sound driving circuit 171 and the second sound generator 220 may be electrically connected to each other by metal lines of the control circuit board 160.

The third sound generator 230 may receive the third sound signal including the $(3A)^{th}$ driving voltage and the $(3B)^{th}$ driving voltage from the sound driving circuit 171. The third sound generator 230 may output sound by vibrating the display panel 110 based on the $(3A)^{th}$ driving voltage and the $(3B)^{th}$ driving voltage.

The fourth sound generator 240 may receive the fourth sound signal including the $(4A)^{th}$ driving voltage and the $(4B)^{th}$ driving voltage from the sound driving circuit 171. The fourth sound generator 240 may output sound by vibrating the display panel 110 based on the $(4A)^{th}$ driving voltage and the $(4B)^{th}$ driving voltage.

In embodiments of the invention, the number of sound generators implemented as exciters and the number of sound generators implemented as piezoelectric elements are not limited to those illustrated in FIGS. 3 through 5.

In an embodiment, the sound driving circuit 171 may be disposed on the control circuit board 160 as illustrated in FIG. 3, and the third sound generator 230 and the fourth sound generator 240 may be disposed on the surface of the heat dissipation film 130. In such an embodiment, the third sound signal of the sound driving circuit 171 may be transmitted to the third sound generator 230 via a cable 150, the source circuit board 140, and the first sound circuit board 250. In an embodiment, the fourth sound signal of the sound driving circuit 171 may be transmitted to the fourth sound generator 240 via a cable 150, the source circuit board 140, and the second sound circuit board 260.

A first buffer member 190 effectively prevents the display panel 110 from colliding with the lower cover 180 and being damaged due to large vibration displacement of the display panel 110 when the display panel 110 is vibrated by the first sound generator 210 and by the second sound generator 220. In such an embodiment, the first buffer member 190 may surround each of the first sound generator 210 and the second sound generator 220. In one embodiment, for example, as illustrated in FIG. 3, the first buffer member 190 may surround each of the first sound generator 210 and the second sound generator 220 in a circular shape when seen in a plan view. In such an embodiment, a distance between the first buffer member 190 and the first sound generator 210 and between the first buffer member 190 and the second sound generator 220 may be substantially constant.

Figure 31:
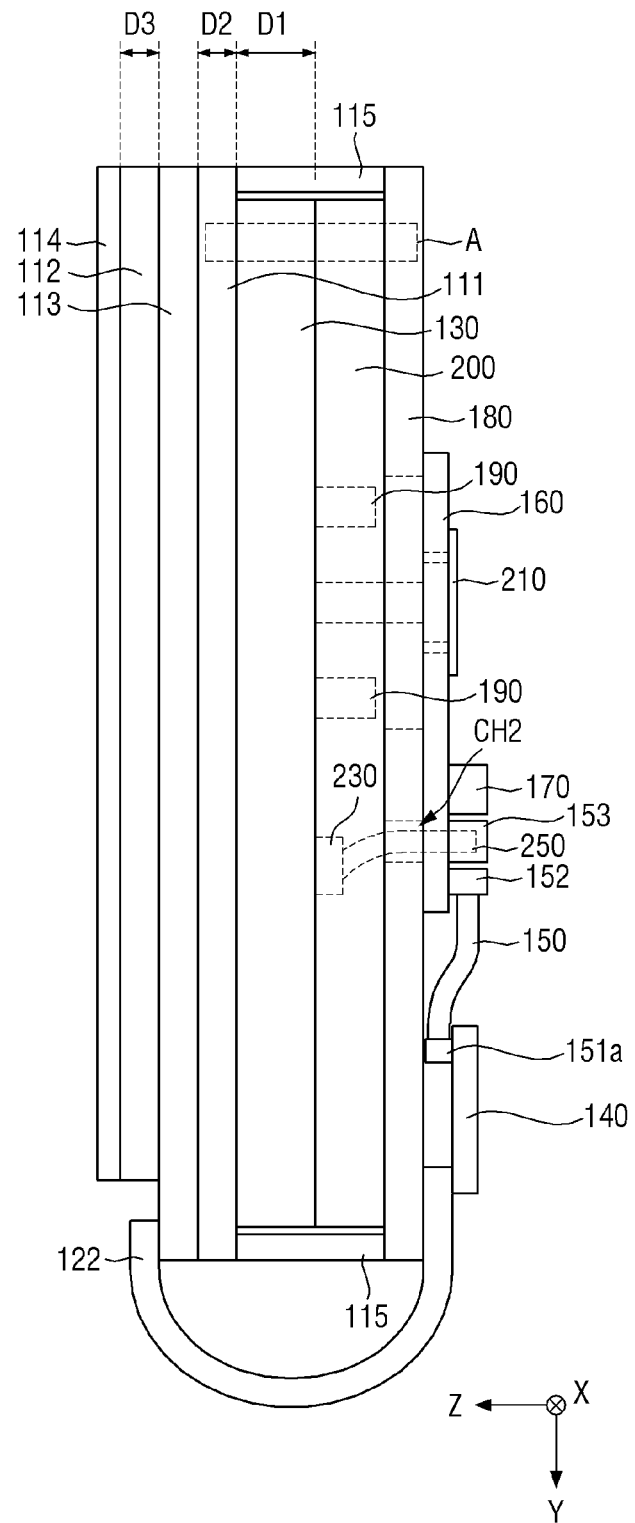
FIG. 31 is a side view of another alternative of the display device of FIG. 2.

In an embodiment, the first buffer member 190 may be attached to a second surface of the control circuit board 160 or the second surface of the lower cover 180 as illustrated in FIG. 5. Alternatively, the first buffer member 190 may be attached onto the surface of the heat dissipation film 130 as illustrated in FIG. 31. In such an embodiment, the height of the first buffer member 190 is less than the distance between the surface of the heat dissipation film 130 and the second surface of the control circuit board 160. In such an embodiment, the first buffer member 190 and the heat dissipation film 130 is spaced apart from each other with a gap therebetween. In an embodiment, the height of the first buffer member 190 may be less than a height H1 of the first sound generator 210 and a height of the second sound generator 220. The height H1 of the first sound generator 210 may be a distance from a bobbin 212 of the first sound generator 210 to a lower plate thereof as illustrated in FIG. 5.

Figure 32:
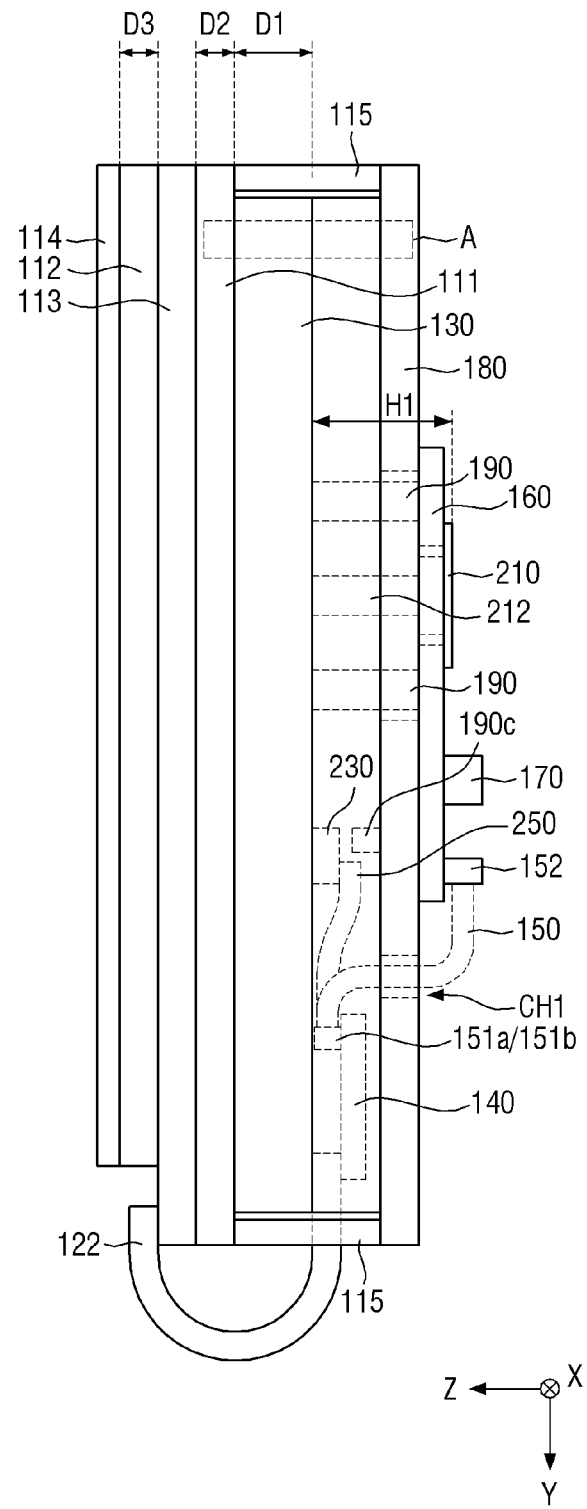
FIG. 32 is a side view of another alternative of the display device of FIG. 2.

Alternatively, the first buffer member 190 may be attached to the surface of the heat dissipation film 130 and the second surface of the control circuit board 160 or the second surface of the lower cover 180 as illustrated in FIG. 32. In such an embodiment, the height of the first buffer member 190 may be substantially equal to the distance between the surface of the heat dissipation film 130 and the second surface of the control circuit board 160.

A second buffer member 190c effectively prevents the display panel 110 from colliding with the lower cover 180 and being damaged due to substantial vibration displacement of the display panel 110 when the display panel 110 is vibrated by the third sound generator 230 and the fourth sound generator 240. In such an embodiment, the second buffer member 190c may overlap the third sound generator 230 and the fourth sound generator 240. In one embodiment, for example, the second buffer member 190c may be attached to the second surface of the lower cover 180 or the second surface of the control circuit board 160 as illustrated in FIG. 5. Alternatively, the second buffer member 190c may be disposed on the surface of the third sound generator 230 and the surface of the fourth sound generator 240.

In an embodiment, the height of the second buffer member 190c may be less than that of the first buffer member 190. In such an embodiment, the height of the second buffer member 190c is less than the distance between the first surface of the heat dissipation film 130 and the second surface of the control circuit board 160 or the second surface of the lower cover 180. Therefore, in an embodiment where the second buffer member 190c is attached to the second surface of the lower cover 180 or the second surface of the control circuit board 160 as illustrated in FIG. 5, a gap may exist between the second buffer member 190c and the third sound generator 230 and between the second buffer member 190c and the fourth sound generator 240. Alternatively, in an embodiment where the second buffer member 190c is disposed on the surface of the third sound generator 230 and the surface of the fourth sound generator 240, there may a gap between the second buffer member 190c and the control circuit board 160 or the lower cover 180.

According to an embodiment, as shown in FIGS. 3 through 5, the third sound generator 230 and the source circuit board 140 are connected by the first sound circuit board 250, and the fourth sound generator 240 and the source circuit board 140 are connected by the second sound circuit board 260. Therefore, in an embodiment where the third sound generator 230 and the fourth sound generator 240 are disposed on the surface of the heat dissipation film 130 while the control circuit board 160 is disposed on the first surface of the lower cover 180, the control circuit board 160 and the third sound generator 230 may be easily or effectively electrically connected to each other, and the control circuit board 160 and the fourth sound generator 240 may be easily or effectively electrically connected to each other.

FIG. 6 is a bottom view of the heat dissipation film 130, the adhesive member 115, a blocking member 200 and the first through fourth sound generators 210 through 240 of the display device. In FIG. 6, only the first substrate 111, the first adhesive member 115, the heat dissipation film 130, the blocking member 200 and the first through fourth sound generators 210 through 240 of the display panel 110 are illustrated for ease of description. That is, the source driving circuits 121, the flexible films 122, the source circuit boards 140, the cables 150, the control circuit board 160, the timing control circuit 170 and the lower cover 180 are omitted from FIG. 6.

Referring to FIG. 6, as described above, the size of the heat dissipation film 130 may be smaller than that of the first substrate 111. Therefore, four edges of the surface of the first substrate 111 may be exposed without being covered by the heat dissipation film 130.

The first adhesive member 115 may be disposed on the exposed four edges of the surface of the first substrate 111 which are not covered by the heat dissipation film 130. The first adhesive member 115 may attach the surface of the first substrate 111 to the second surface of the lower cover 180 as illustrated in FIG. 5. The first adhesive member 115 may be a double-sided tape including a buffer layer such as a foam.

The blocking member 200 may block the propagation of vibrations of the display panel 110 generated by each of the first through fourth sound generators 210 through 240 or block the transmission of sound generated by the vibration of the display panel 110. In an embodiment, the blocking member 200 may be attached to the surface of the heat dissipation film 130 and the second surface of the lower cover 180 to block the propagation of vibrations of the display panel 110 or the transmission of sound.

The blocking member 200 may be disposed on four edge portions of the heat dissipation film 130. The blocking member 200 may attach the surface of the heat dissipation film 130 to the second surface of the lower cover 180. The height of the blocking member 200 is greater than the height of the first buffer member 190 and the height of the second buffer member 190c.

The surface of the heat dissipation film 130 may be divided into first through sixth areas A1 through A6 by the blocking member 200 as illustrated in FIG. 6.

The first area A1 is an area where the first sound generator 210 is disposed and may be defined by the blocking member 200 disposed to surround the first sound generator 210. The second area A2 is an area where the second sound generator 220 is disposed and may be defined by the blocking member 200 disposed to surround the second sound generator 220. The size of the first area A1 and the size of the second area A2 may be substantially the same as each other.

The third area A3 is an area where the third sound generator 230 is disposed and may be defined by the blocking member 200 disposed to surround the third sound generator 230. The fourth area A4 is an area where the fourth sound generator 240 is disposed and may be defined by the blocking member 200 disposed to surround the four sound generator 240. In an embodiment, as shown in FIG. 6, the size of the third area A3 and the size of the fourth area A4 may be smaller than the size of the first area A1 and the size of the second are A2, respectively.

The fifth area A5 is an area where the source circuit boards 140 are disposed and may be defined by the blocking member 200 disposed to surround the source circuit boards 140. The fifth area A5 may effectively prevent or substantially reduce the effect of the first through fourth sound generators 210 through 240 of the first through fourth areas A1 through A4 on the source circuit boards 140, the source driving circuits 121 and the flexible films 122.

The sixth area A6 is an area between the first area A1 and the second area A2. No sound generator may be disposed in the sixth area A6. The sixth area A6 may increase the distance between the first area A1 and the second area A2. Therefore, in such an embodiment, the effect of vibrations of the display panel 110 generated by the first sound generator 210 of the first area A1 on vibrations of the display panel 110 generated by the second sound generator 220 of the second area A2 or the effect of vibrations of the display panel 110 generated by the second sound generator 220 of the second area A2 on vibrations of the display panel 110 generated by the first sound generator 210 of the first area A1 may be effectively prevented or substantially reduced.

Alternatively, the sixth area A6 may be omitted, and the first area A1 and the second area A2 may be disposed adjacent to each other.

According to an embodiment, as shown in FIG. 6, each of the first through fourth sound generators 210 through 240 is surrounded by the blocking member 200. Therefore, the effect of vibrations of the display panel 110 generated by each of the first through fourth sound generators 210 through 240 on vibrations of the display panel 110 generated by an adjacent sound generator may be effectively prevented or substantially reduced.

FIG. 7 is a cross-sectional view of an embodiment of the display area of the display panel 110.

Referring to FIG. 7, an embodiment of the display panel 110 may include the first substrate 111, the second substrate 112, the thin-film transistor layer TFTL, the light emitting element layer EML, the filler FL, the wavelength conversion layer QDL, and the color filter layer CFL.

A buffer layer 302 may be disposed on a surface of the first substrate 111 which faces the second substrate 112. The buffer layer 302 may be disposed on the first substrate 111 to protect thin-film transistors 335 and light emitting elements from moisture that may be introduced through the first substrate 111 which may be vulnerable to moisture penetration. The buffer layer 302 may include or be composed of a plurality of inorganic layers stacked alternately. In one embodiment, for example, the buffer layer 302 may be a multilayer in which one or more inorganic layers including at least one selected from a silicon oxide (SiOx) layer, a silicon nitride (SiNx) layer and SiON are alternately stacked. Alternatively, the buffer layer 302 may be omitted.

The thin-film transistor layer TFTL is disposed on the buffer layer 302. The thin-film transistor layer TFTL includes the thin-film transistors 335, a gate insulating layer 336, an interlayer insulating film 337, a protective layer 338, and a planarization layer 339.

The thin-film transistors 335 are disposed on the buffer layer 302. Each of the thin-film transistors 335 includes an active layer 331, a gate electrode 332, a source electrode 333, and a drain electrode 334. In an embodiment, as shown in FIG. 7, each of the thin-film transistors 335 is a top-gate type in which the gate electrode 332 is located above the active layer 331, but the disclosure is not limited thereto. Alternatively, each of the thin-film transistors 335 may also be a bottom-gate type in which the gate electrode 332 is located under the active layer 331 or a double-gate type in which the gate electrode 332 is located both above and under the active layer 331.

The active layers 331 are disposed on the buffer layer 302. The active layers 331 may include or be made of a silicon-based semiconductor material or an oxide-based semiconductor material. A light shielding layer may be disposed between the buffer layer 302 and the active layers 331 to block external light from entering the active layers 331.

The gate insulating layer 336 may be disposed on the active layers 331. The gate insulating layer 336 may be an inorganic layer, for example, a SiOx layer, a SiNx layer, or a multilayer including or composed of these layers.

The gate electrodes 332 and gate lines may be disposed on the gate insulating layer 336. Each of the gate electrodes 332 and the gate lines may be a single layer or a multilayer including or made of any one or more of molybdenum (Mo), aluminum (Al), chromium (Cr), gold (Au), titanium (Ti), nickel (Ni), neodymium (Ne), copper (Cu), and an alloy thereof.

The interlayer insulating film 337 may be disposed on the gate electrodes 332 and the gate lines. The interlayer insulating film 337 may be an inorganic layer, for example, a SiOx layer, a SiNx layer, or a multilayer including or composed of these layers.

The source electrodes 333, the drain electrodes 334, and data lines may be disposed on the interlayer insulating film 337. Each of the source electrodes 333 and the drain electrodes 334 may be connected to an active layer 331 through a contact hole defined through the gate insulating layer 336 and the interlayer insulating film 337. Each of the source electrodes 333, the drain electrodes 334 and the data lines may be a single layer or a multilayer including or made of any one or more of molybdenum (Mo), aluminum (Al), chromium (Cr), gold (Au), titanium (Ti), nickel (Ni), neodymium (Ne), copper (Cu), and an alloy thereof.

The protective layer 338 for insulating the thin-film transistors 335 may be disposed on the source electrodes 333, the drain electrodes 334, and the data lines. The protective layer 338 may be an inorganic layer, for example, a SiOx layer, a SiNx layer, or a multilayer including or composed of these layers.

The planarization layer 339 may be disposed on the protective layer 338 to planarize steps due to the thin-film transistors 335. The planarization layer 339 may include or be made of an organic layer such as acryl resin, epoxy resin, phenolic resin, polyamide resin, or polyimide resin.

The light emitting element layer EML is disposed on the thin-film transistor layer TFTL. The light emitting element layer EML includes light emitting elements and a pixel defining layer 344.

The light emitting elements and the pixel defining layer 344 are disposed on the planarization layer 339. The light emitting elements may be organic light emitting elements. In such an embodiment, each of the light emitting elements may include an anode 341, a light emitting layer 342, and a cathode 343.

The anodes 341 may be disposed on the planarization layer 339. The anodes 341 may be connected to the drain electrodes 334 of the thin-film transistors 335 through contact holes defined through the protective layer 338 and the planarization layer 339.

The pixel defining layer 344 may be disposed on the planarization layer 339 and may cover edges of the anodes 341 to define pixels. In an embodiment, the pixel defining layer 344 defines subpixels PX1 through PX3. Each of the subpixels PX1 through PX3 is an area in which the anode 341, the light emitting layer 342 and the cathode 343 are sequentially stacked so that holes from the anode 341 and electrons from the cathode 343 combine together in the light emitting layer 342 to emit light.

The light emitting layer 342 is disposed on the anodes 341 and the pixel defining layer 344. The light emitting layer 342 may be an organic light emitting layer. The light emitting layer 342 may emit light having a short wavelength, such as a blue light or an ultraviolet light. The blue light may have a peak wavelength range of about 450 nanometers (nm) to about 490 nm, and the ultraviolet light may have a peak wavelength range of less than about 450 nm. In such an embodiment, the light emitting layer 342 may be a common layer commonly disposed to cover all of the subpixels PX1 through PX3. In such an embodiment, the display panel 110 may include the wavelength conversion layer QDL for converting short-wavelength light such as a blue light or an ultraviolet light emitted from the light emitting layer 342 into a red light, a green light and a blue light and the color filter layer CFL which transmits each of the red light, the green light and the blue light.

The light emitting layer 342 may include a hole transporting layer, a light emitting layer, and an electron transporting layer. In addition, the light emitting layer 342 have a tandem structure of two or more stacks, where a charge generating layer may be formed between the stacks.

The cathode 343 is disposed on the light emitting layer 342. The cathode 343 may be disposed to cover the light emitting layer 342. The cathode 343 may be a common layer commonly disposed to cover all pixels.

The light emitting element layer EML may be top emission type which emits light toward the second substrate 112, that is, in an upward direction. In such an embodiment, the anodes 341 may include or be made of a metal material having high reflectivity, such as a stacked structure (Ti/Al/Ti) of Al and Ti, a stacked structure (ITO/Al/ITO) of Al and indium tin oxide ("ITO"), an APC alloy, or a stacked structure (ITO/APC/ITO) of an APC alloy and ITO. Here, the APC alloy is an alloy of Ag, palladium (Pd), and Cu. In an embodiment, the cathode 343 may include or be made of a transparent conductive material ("TCO") capable of transmitting light, such as ITO or indium zinc oxide ("IZO"), or a semi-transmissive conductive material such as magnesium (Mg), Ag or an alloy of Mg and Ag. In an embodiment, where the cathode 343 includes or is made of a semi-transmissive conductive material, the light output efficiency may be increased by a microcavity-effect.

A thin-film encapsulation layer 345 is disposed on the light emitting element layer EML. The thin-film encapsulation layer 345 may prevent oxygen or moisture from permeating the light emitting layer 342 and the cathode 343. In such an embodiment, the thin-film encapsulation layer 345 may include at least one inorganic layer. The inorganic layer may include or be made of silicon nitride, aluminum nitride, zirconium nitride, titanium nitride, hafnium nitride, tantalum nitride, silicon oxide, aluminum oxide, or titanium oxide. In an embodiment, the thin-film encapsulation layer 345 may further include at least one organic layer. The organic layer may have a sufficient thickness to prevent particles from penetrating the thin-film encapsulation layer 345 and entering the light emitting layer 342 and the cathode 343. The organic layer may include at least one of epoxy, acrylate, and urethane acrylate.

The color filter layer CFL is disposed on a surface of the second substrate 112 which faces the first substrate 111. The color filter layer CFL may include a black matrix 360 and color filters 370.

The black matrix 360 may be disposed on the surface of the second substrate 112. The black matrix 360 may not overlap the subpixels PX1 through PX3 and may overlap the pixel defining layer 344. The black matrix 360 may include black dye capable of blocking light or an opaque metal material.

The color filters 370 may be disposed to overlap the subpixels PX1 through PX3. A first color filter 371 may overlap a first subpixel PX1, a second color filter 372 may overlap a second subpixel PX2, and a third color filter 373 may overlap a third subpixel PX3. In such an embodiment, the first color filter 371 may be a first color light transmitting filter that transmits light of a first color, the second color filter 372 may be a second color light transmitting filter that transmits light of a second color, and the third color filter 373 may be a third color light transmitting filter that transmits light of a third color. In one embodiment, for example, the first color may be a red color, the second color may be a green color, and the third color may be a blue color. In such an embodiment, the peak wavelength range of the red light transmitted through the first color filter 371 may be about 620 nm to about 750 nm, the peak wavelength range of the green light transmitted through the second color filter 372 may be about 500 nm to about 570 nm, and the peak wavelength range of the blue light transmitted through the third color filter 373 may be about 450 nm to about 490 nm.

In an embodiment, edges of two adjacent color filters may overlap the black matrix 360. Therefore, the black matrix 360 may effectively prevent color mixing that occurs when light emitted from the light emitting layer 342 of a subpixel travels to a color filter of an adjacent subpixel.

An overcoat layer may be disposed on the color filters 370 to planarize a step due to the black matrix 360. Alternatively, the overcoat layer may be omitted.

The wavelength conversion layer QDL is disposed on the color filter layer CFL. The wavelength conversion layer QDL may include a first capping layer 351, a first wavelength conversion layer 352, a second wavelength conversion layer 353, a third wavelength conversion layer 354, a second capping layer 355, an interlayer organic film 356, and a third capping layer 357.

The first capping layer 351 may be disposed on the color filter layer CFL. The first capping layer 351 may effectively prevent moisture or oxygen from permeating into the first wavelength conversion layer 352, the second wavelength conversion layer 353 and the third wavelength conversion layer 354 from the outside through the color filter layer CFL. The first capping layer 351 may include or be made of an inorganic layer such as silicon nitride, aluminum nitride, zirconium nitride, titanium nitride, hafnium nitride tantalum nitride, silicon oxide, aluminum oxide, or titanium oxide.

The first wavelength conversion layer 352, the second wavelength conversion layer 353 and the third wavelength conversion layer 354 may be disposed on the first capping layer 351.

The first wavelength conversion layer 352 may overlap the first subpixel PX1.

The first wavelength conversion layer 352 may convert short-wavelength light such as a blue light or an ultraviolet light emitted from the light emitting layer 342 of the first subpixel PX into light of the first color. In such an embodiment, the first wavelength conversion layer 352 may include a first base resin, a first wavelength shifter, and a first scatterer.

The first base resin may be a material having high light transmittance and high dispersion characteristics for the first wavelength shifter and the first scatterer. In one embodiment, tor example, the first base resin may include an organic material such as epoxy resin, acrylic resin, cardo resin, or imide resin.

The first wavelength shifter may convert or shift the wavelength range of incident light. The first wavelength shifter may be quantum dots, a quantum rod, or a phosphor. In one embodiment, for example, the first wavelength shifter is quantum dots, which may be a semiconductor nanocrystalline material and have a specific band gap according to the composition and size thereof. Thus, the first wavelength shifter may absorb incident light and then emit light having a unique wavelength. In such an embodiment, the first wavelength shifter may have a core-shell structure including a core containing a nanocrystal and a shell surrounding the core. In such an embodiment, the nanocrystal that forms the core may include a group IV nanocrystal, a group II-VI compound nanocrystal, a group III-V compound nanocrystal, a group IV-VI nanocrystal, and combinations of the same. The shell may serve as a protective layer for maintaining semiconductor characteristics by preventing chemical denaturation of the core and/or as a charging layer for giving electrophoretic characteristics to the quantum dot. In such an embodiment, the shell may be a single layer or a multilayer. The shell may be, for example, a metal or non-metal oxide, a semiconductor compound, or a combination thereof.

The first scatterer may have a refractive index different from that of the first base resin and form an optical interface with the first base resin. In one embodiment, for example, the first scatterer may be light scattering particles. In one embodiment, for example, the first scatterer may be metal oxide particles including titanium oxide ($TiO_2$), silicon oxide ($SiO_2$), zirconium oxide ($ZrO_2$), aluminum oxide ($Al_2O_3$), indium oxide ($In_2O_3$), zinc oxide (ZnO), or tin oxide ($SnO_2$). Alternatively, the first scatterer may be organic particles including acrylic resin or urethane resin.

The first scatterer may scatter incident light in random directions without substantially changing the wavelength of the light transmitted through the first wavelength conversion layer 352. Accordingly, the first scatterer may increase the length of the path of the light transmitted through the first wavelength conversion layer 352, thereby increasing the color conversion efficiency of the first wavelength shifter.

In an embodiment, the first wavelength conversion layer 352 may overlap the first color filter 371. Therefore, a portion of short-wavelength light such as a blue light or an ultraviolet light provided from the first subpixel PX1 may pass through the first wavelength conversion layer 352 without being converted into light of the first color by the first wavelength shifter. In such an embodiment, the short-wavelength light such as a blue light or an ultraviolet light incident on the first color filter 371 without being converted by the first wavelength conversion layer 352 may not pass through the first color filter 371. In such an embodiment, light of the first color output from the first wavelength conversion layer 352 may pass through the first color filter 371 and proceed toward the second substrate 112.

The second wavelength conversion layer 353 may overlap the second subpixel PX2. The second wavelength conversion layer 353 may convert short-wavelength light such as a blue light or an ultraviolet light emitted from the light emitting layer 342 of the second subpixel PX2 into light of the second color. In such an embodiment, the second wavelength conversion layer 353 may include a second base resin, a second wavelength shifter, and a second scatterer. The second base resin, the second wavelength shifter and the second scatterer of the second wavelength conversion layer 353 are substantially the same as those of the first wavelength conversion layer 352, and thus any repetitive detailed description thereof will be omitted. In an embodiment where the first wavelength shifter and the second wavelength shifter are quantum dots, the diameter of the second wavelength shifter may be less than that of the first wavelength shifter.

In an embodiment, the second wavelength conversion layer 353 may overlap the second color filter 372. Therefore, a portion of short-wavelength light such as a blue light or an ultraviolet light provided from the second subpixel PX2 may pass through the second wavelength conversion layer 353 without being converted into light of the second color by the second wavelength shifter. In such an embodiment, the short-wavelength light such as a blue light or an ultraviolet light incident on the second color filter 372 without being converted by the second wavelength conversion layer 353 may not pass through the second color filter 372. In such an embodiment, light of the second color output from the second wavelength conversion layer 353 may pass through the second color filter 372 and proceed toward the second substrate 112.

The third wavelength conversion layer 354 may overlap the third subpixel PX3. The third wavelength conversion layer 354 may convert short-wavelength light such as blue light or ultraviolet light emitted from the light emitting layer 342 of the third subpixel PX3 into light of the third color. In such an embodiment, the third wavelength conversion layer 354 may include a third base resin and a third scatterer. The third base resin and the third scatterer of the third wavelength conversion layer 354 are substantially the same as those of the first wavelength conversion layer 352, and thus any repetitive detailed description thereof will be omitted.

In such an embodiment, the third wavelength conversion layer 354 may overlap the third color filter 373. Therefore, short-wavelength light such as a blue light or an ultraviolet light provided from the third subpixel PX3 may pass through the third wavelength conversion layer 354 as it is, and the light that passes through the third wavelength conversion layer 354 may pass through the third color filter 373 and proceed toward the second substrate 112.

The second capping layer 355 may be disposed on the first wavelength conversion layer 352, the second wavelength conversion layer 353, the third wavelength conversion layer 354, and portions of the first capping layer 351 not covered by the wavelength conversion layers 352 through 354. The second capping layer 355 effectively prevents moisture or oxygen from permeating into the first wavelength conversion layer 352, the second wavelength conversion layer 353 and the third wavelength conversion layer 354 from the outside. The second capping layer 355 may include or be made of an inorganic layer such as silicon nitride, aluminum nitride, zirconium nitride, titanium nitride, hafnium nitride, tantalum nitride, silicon oxide, aluminum oxide, or titanium oxide.

The interlayer organic film 356 may be disposed on the second capping layer 355. The interlayer organic film 356 may be a planarization layer for planarizing steps due to the wavelength conversion layers 352 through 354. The interlayer organic film 356 may include or be made of an organic layer such as acryl resin, epoxy resin, phenolic resin, polyamide resin, or polyimide resin.

The third capping layer 357 may be disposed on the interlayer organic film 356. The third capping layer 357 may include or be made of an inorganic layer such as silicon nitride, aluminum nitride, zirconium nitride, titanium nitride, hafnium nitride, tantalum nitride, silicon oxide, aluminum oxide, or titanium oxide.

The filler FL may be disposed between the thin-film encapsulation layer 345 disposed on the first substrate 111 and the third capping layer 357 disposed on the second substrate 112. The filler FL may include or be made of a material having a buffer function. In one embodiment, for example, the filler FL may include or be made of an organic layer such as acryl resin, epoxy resin, phenolic resin, polyamide resin, or polyimide resin.

In an embodiment, a sealing material for bonding the first substrate 111 and the second substrate 112 may be disposed in the non-display area of the display panel 110. When seen in a plan view, the filler FL may be surrounded by the sealing material. The sealing material may be a glass frit or a sealant.

According to an embodiment, as shown in FIG. 7, the first through third subpixels PX1 through PX3 may emit short-wavelength light such as a blue light or an ultraviolet light. Light of the first subpixel PX1 is converted into light of the first color by the first wavelength conversion layer 352 and then output through the first color filter CF1. Light of the second subpixel PX2 is converted into light of the second color by the second wavelength conversion layer 353 and then output through the second color filter CF2. Light of the third subpixel PX3 is output through the third wavelength conversion layer 354 and the third color filter CF3. Therefore, white light may be output form the display area of the display panel 110.

In an embodiment, as shown in FIG. 7, the subpixels PX1 through PX3 are a top emission type which emits light toward the second substrate 112, that is, in the upward direction. Therefore, the heat dissipation film 130 including an opaque material such as graphite or aluminum may be disposed on the surface of the first substrate 111.

FIG. 8 is a cross-sectional view showing an embodiment of the first sound generator 210 and the second sound generator 220 of FIG. 3. FIG. 8 is a cross-sectional view taken along line I-I' of FIG. 3.

Referring to FIG. 8, each of the first sound generator 210 and the second sound generator 220 may be an exciter that vibrates the display panel 110 by generating a magnetic force using a voice coil. In such an embodiment, holes may be defined in areas of the control circuit board 160 where the first sound generator 210 and the second sound generator 220 are disposed.

Each of the first sound generator 210 and the second sound generator 220 may include a magnet 211, the bobbin 212, a voice coil 213, a damper 214, and the lower plate 215.

The magnet 211 is a permanent magnet, and a sintered magnet such as barium ferrite can be used. The material of the magnet 211 may be, but is not limited to, ferric trioxide ($Fe_2O_3$), barium carbonate ($BaCO_3$), a neodymium magnet, strontium ferrite with an improved magnetic component, or an aluminum (Al), nickel (Ni) or cobalt (Co) alloy cast magnet. The neodymium magnet may be, for example, neodymium-iron-boron (Nd—Fe—B).

The magnet 211 may include a plate 211a, a central protrusion 211b protruding from a center of the plate 211a, and sidewalls 211c protruding edges of the plate 211a. The central protrusion 211b and the sidewalls 211c may be spaced apart from each other by a predetermined distance. Therefore, a predetermined space may be defined between the central protrusion 211b and each of the sidewalls 211c. In an embodiment, the magnet 211 may be shaped like a circular cylinder, e.g., a circular cylinder having a circular space formed in any one bottom surface of the circular cylinder.

The central protrusion 211b of the magnet 211 may have the magnetism of a north (N) pole, and the plate 211a and the sidewalls 211c may have the magnetism of a south (S) pole. Therefore, an external magnetic field may be formed between the central protrusion 211b and the plate 211b of the magnet 211 and between the central protrusion 211b and the sidewalls 211c.

The bobbin 212 may be cylindrical. The central protrusion 211b of the magnet 211 may be disposed inside the bobbin 212. In such an embodiment, the bobbin 212 may surround the central protrusion 211b of the magnet 211. In such an embodiment, the sidewalls 211c of the magnet 211 may be disposed outside the bobbin 212. That is, the sidewalls 211c of the magnet 211 may surround the bobbin 212. A space may be defined between the bobbin 212 and the central protrusion 211b of the magnet 211 and between the bobbin 212 and the sidewalls 211c of the magnet 211.

The bobbin 212 may include or be made of a material obtained by processing pulp or paper, aluminum or magnesium or an alloy thereof, a synthetic resin such as polypropylene, or a polyamide-based fiber. An end of the bobbin 212 may be attached to the heat dissipation film 130 using an adhesive member. The adhesive member may be a double-sided tape.

The voice coil 213 is wound on an outer circumferential surface of the bobbin 212. An end of the voice coil 213 which is adjacent to the end of the bobbin 212 may receive the $(1A)^{th}$ driving voltage or the $(2A)^{th}$ driving voltage, and the other end of the voice coil 213 which is adjacent to the other end of the bobbin 212 may receive the $(1B)^{th}$ driving voltage or the $(2B)^{th}$ driving voltage. Therefore, an electric current may flow through the voice coil 213 according to the $(1A)^{th}$ driving voltage or the $(2A)^{th}$ driving voltage and the $(1B)^{th}$ driving voltage or the $(2B)^{th}$ driving voltage. An applied magnetic field corresponding to the electric current flowing through the voice coil 213 may be formed around the voice coil 213. The direction of the electric current flowing through the voice coil 213 may be opposite when the (1A)$^{th}$ driving voltage or the (2A)$^{th}$ driving voltage is a positive voltage and the (1B)$^{th}$ driving voltage or the (2B)$^{th}$ driving voltage is a negative voltage and when the (1A)$^{th}$ driving voltage or the (2A)$^{th}$ driving voltage is a negative voltage and the (1B)$^{th}$ driving voltage or the (2B)$^{th}$ driving voltage is a positive voltage. Therefore, the N pole and the S pole of the applied magnetic field formed around the voice coil 213 may be changed according to the alternating current ("AC") driving of the (1A)$^{th}$ driving voltage or the (2A)$^{th}$ driving voltage and the (1B)$^{th}$ driving voltage or the (2B)$^{th}$ driving voltage. Accordingly, an attractive force and a repulsive force alternately act on the magnet 211 and the voice coil 213, such that the bobbin 212 on which the voice coil 213 is wound reciprocates in the third direction (Z-axis direction) as illustrated in FIGS. 10A and 10B. Accordingly, the display panel 110 and the heat dissipation film 130 vibrate in the third direction (Z-axis direction), thereby outputting a sound.

The damper 214 is disposed between a portion of an upper side of the bobbin 212 and the sidewalls 211c of the magnet 211. The damper 214 adjusts the up and down vibration of the bobbin 212 by contacting or relaxing according to the up and down movement of the bobbin 212. In such an embodiment, where the damper 214 is connected to the bobbin 212 and the sidewalls 211c of the magnet 211, the up and down movement of the bobbin 212 may be limited by a restoring force of the damper 214. In one embodiment, for example, when the bobbin 212 vibrates above a predetermined height or vibrates below a predetermined height, it may be returned to its original position by the restoring force of the damper 214.

The lower plate 215 may be disposed on a lower surface of the magnet 211. The lower plate 215 may be formed integrally with the magnet 211 or may be formed separately from the magnet 211. In an embodiment, where the lower plate 215 is formed separately from the magnet 211, the magnet 211 may be attached to the lower plate 215 with an adhesive member such as a double-sided tape.

The lower plate 215 may be fixed to the control circuit board 160 by a fixing members 216 such as a screw. Accordingly, the magnet 211 of each of the first sound generator 210 and the second sound generator 220 may be fixed to the control circuit board 160.

In an embodiment, as described above, the magnet 211 of each of the first sound generator 210 and the second sound generator 220 is fixed to the control circuit board 160, but embodiments of the specification are not limited thereto. Alternatively, the magnet 211 of each of the first sound generator 210 and the second sound generator 220 may be fixed to the system circuit board, the power circuit board, or a dummy circuit board instead of the control circuit board 160. The dummy circuit board refers to a circuit board on which any other circuit other than the first sound generator 210 or the second sound generator 220 is not disposed. In an embodiment, the first sound generator 210 or the second sound generator 220 is only disposed on the dummy circuit board. The dummy circuit board may be a flexible printed circuit board or a printed circuit board.

The first buffer member 190 may be attached to the second surface of the control circuit board 160. The height of the first buffer member 190 is less than the distance between the surface of the heat dissipation film 130 and the second surface of the control circuit board 160. Therefore, a gap may exist between the first buffer member 190 and the heat dissipation film 130. The gap between the first buffer member 190 and the heat dissipation film 130 may be less than a gap between the heat dissipation film 130 and the lower cover 180. The first buffer member 190 may include a material having elasticity.

Figure 9:
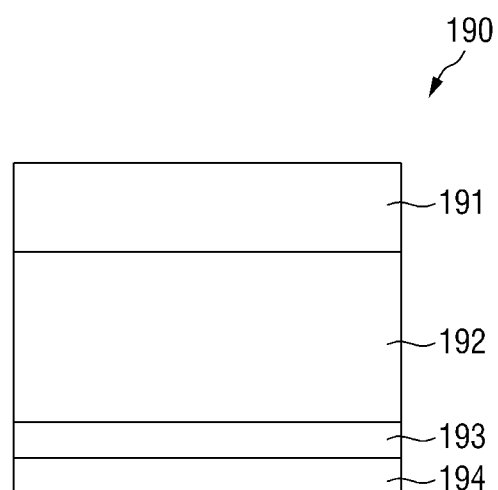
FIG. 9 is a cross-sectional view of an embodiment of a first buffer member illustrated in FIG. 8.

FIG. 9 is a cross-sectional view of an embodiment of a first buffer member illustrated in FIG. 8.

In an embodiment the first buffer member 190 may include a first base film 191, a first buffer layer 192, a first sacrificial layer 193, and an adhesive layer 194 as illustrated in FIG. 9.

The first base film 191 may include or be made of a plastic. In one embodiment, for example, the first base film 191 may be PET.

The first buffer layer 192 may be disposed on a surface of the first base film 191. The first buffer layer 192 may including or be made of a foam having elasticity. In one embodiment, for example, the first buffer layer 192 may include or be made of polyurethane, silicone, rubber, or aerogel.

The first sacrificial layer 193 may be disposed on a surface of the first buffer layer 192. The first sacrificial layer 193 may be separated when the first buffer member 190 has to be detached after being wrongly attached. In such an embodiment, the adhesive layer 194 and a portion of the first sacrificial layer 193 may remain on the second surface of the lower cover 180. The first sacrificial layer 193 may include or be made of a material with low elasticity. In one embodiment, for example, the first sacrificial layer 193 may include or be made of polyurethane. Alternatively, the first sacrificial layer 193 may be omitted.

The adhesive layer 194 may be disposed on a surface of the first sacrificial layer 193. The adhesive layer 194 may be attached onto the second surface of the lower cover 180. The adhesive layer 194 may be, but is not limited to, an acrylic adhesive or a silicone adhesive.

Figure 12:
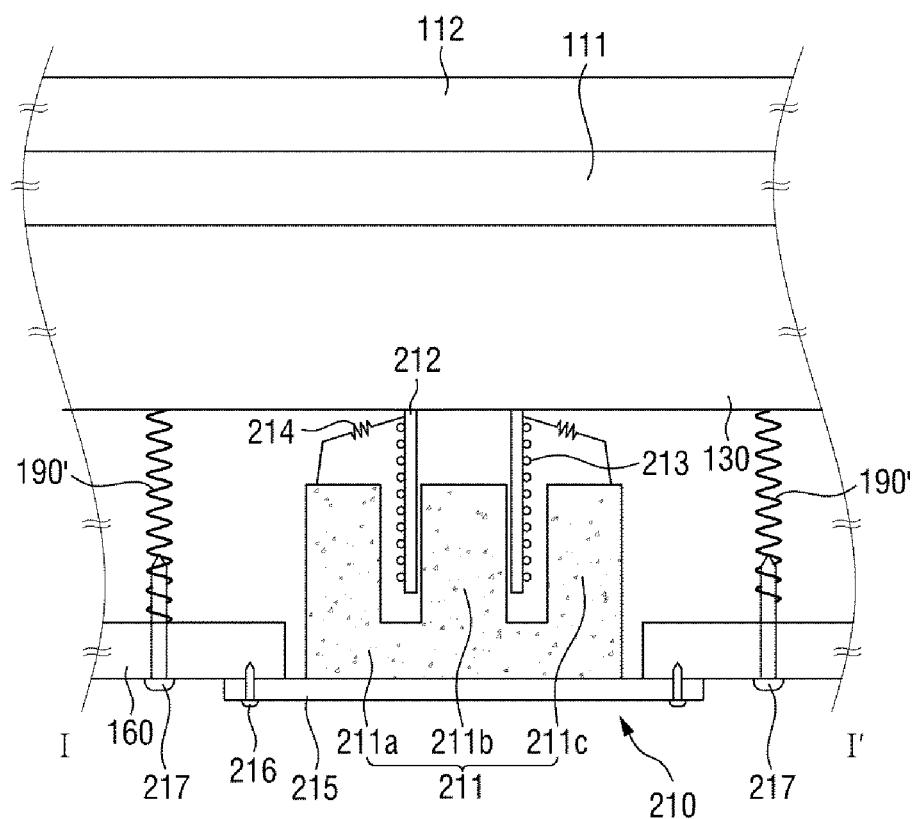
FIG. 12 is a cross-sectional view an alternative embodiment of the first sound generator and the second sound generator of FIG. 3.

In an alternative embodiment, a first buffer layer 190' may be defined by or formed as metal springs as illustrated in FIG. 12. In such an embodiment, each second fixing member 217 may have a protrusion 217a disposed through the control circuit board 160 and protruding from the second surface of the control circuit board 160. The protrusion 217a may be inserted into the first buffer member 190'. An end of the first buffer member 190' may contact the second surface of the lower cover 180, and the other end may contact the surface of the heat dissipation film 130. Alternatively, a side of the first buffer member 190' may contact the second surface of the lower cover 180, but the other end may not contact the surface of the heat dissipation film 130. In such an embodiment, a gap may exist between the first buffer member 190' and the heat dissipation film 130.

The operation of the first buffer member 190 will hereinafter be described in detail with reference to FIGS. 10A, 10B and 11.

Figure 11:
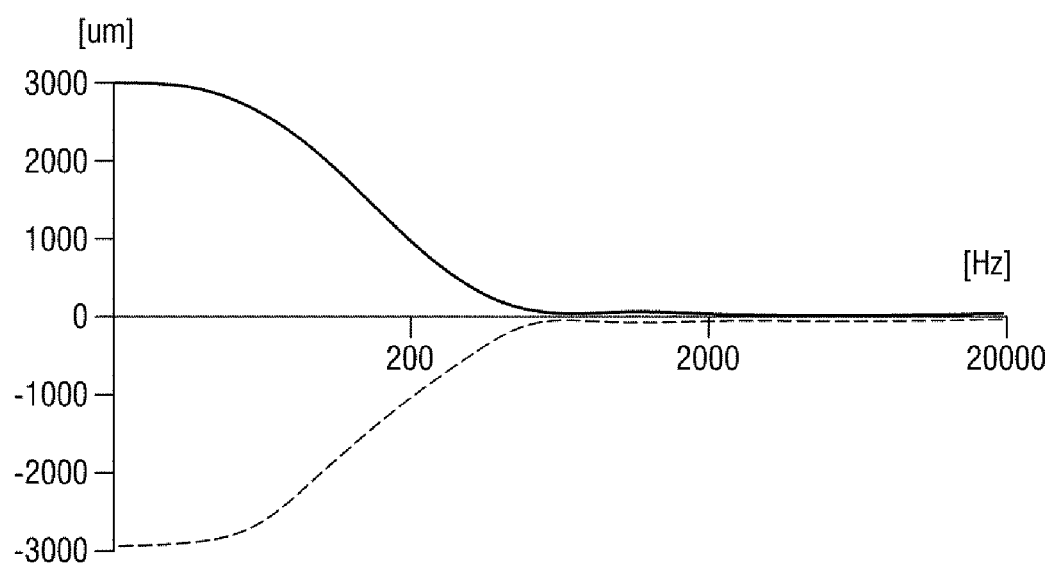
FIG. 11 is a graph illustrating the vibration displacement with respect to the vibration frequency of the display panel by the first sound generator.

FIGS. 10A and 10B illustrate a vibration of the display panel by the first sound generator of FIG. 8, and FIG. 11 is a graph illustrating the vibration displacement with respect to the vibration frequency of the display panel by the first sound generator.

In FIG. 11, the x axis represents the vibration frequency of the display panel 110, and they axis represents the vibration displacement of the display panel 110.

Referring to FIGS. 10A and 10B, the display panel 110 is vibrated up and down by the first sound generator 210 or the second sound generator 220, and sound may be output by the vibration of the display panel 110. Referring to FIG. 11, when the vibration frequency of the display panel 110 is about 200 hertz (Hz) or more, the vibration displacement of the display panel 110 is in a range of negative several hundreds of micrometers to positive several hundreds of micrometers. When the vibration frequency of the display panel 110 is lower than about 200 Hz, the vibration displacement of the display panel 110 is in a range of −3000 micrometers (μm) to 3000 μm. Therefore, if the distance between the heat dissipation film 130 and the lower cover 180 is 3 millimeters (mm) or less, the display panel 110 may collide with the lower cover 180 and be damaged when the display panel 110 is vibrated to produce low-pitched sound by the first sound generator 210 or the second sound generator 220.

In an embodiment of the invention, as described above, the display device 10 includes the first buffer member 190 which is attached onto the second surface of the control circuit board 160, is spaced apart from the heat dissipation film 130 by a gap less than the gap between the heat dissipation film 130 and the lower cover 180, and includes a material having elasticity. Therefore, when the vibration displacement of the display panel 110 is large, the display panel 110 may collide with the first buffer member 190 before colliding with the lower cover 180. Since the first buffer member 190 includes a material having elasticity, even if the first buffer member 190 collides with the display panel 110, the display panel 110 may not be damaged. Therefore, the first buffer member 190 may effectively prevent the display panel 110 from colliding with the lower cover 180 and being damaged.

Figure 13:
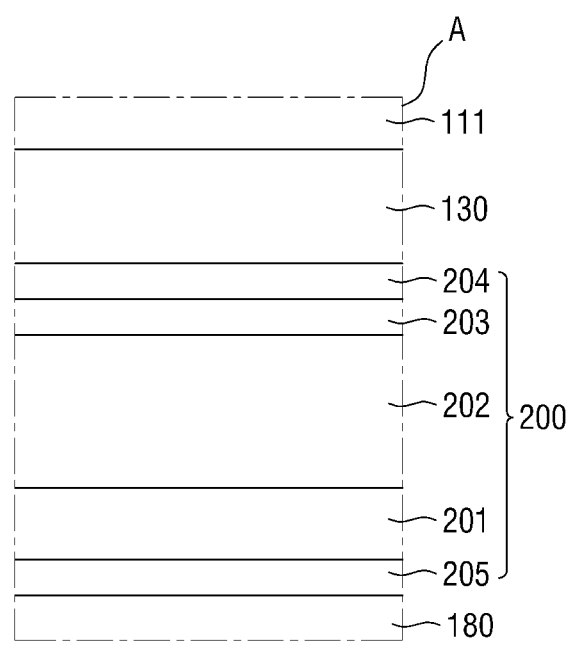
FIG. 13 is an enlarged view of area A of FIG. 5.

FIG. 13 is an enlarged view of area A of FIG. 5.

Referring to FIG. 13, an embodiment of the blocking member 200 may include a second base film 201, a second buffer layer 202, a second sacrificial layer 203, a first adhesive layer 204, and a second adhesive layer 205.

The second base film 201, the second buffer layer 202, the second sacrificial layer 203, and the first adhesive layer 204 of the blocking member 200 may be substantially the same as the first base film 191, the first buffer layer 192, the first sacrificial layer 193 and the adhesive layer 194 of the first buffer member 190 described above with reference to FIG. 9. Therefore, any repetitive detailed description of the second base film 201, the second buffer layer 202, the second sacrificial layer 203 and the first adhesive layer 204 of the blocking member 200 will be omitted.

In such an embodiment, the second adhesive layer 205 may be disposed on a second surface of the second base film 201. The second adhesive layer 205 may be attached onto the surface of the heat dissipation film 130. The second adhesive layer 205 may be, but is not limited to, an acrylic adhesive or a silicone adhesive.

Figure 14:
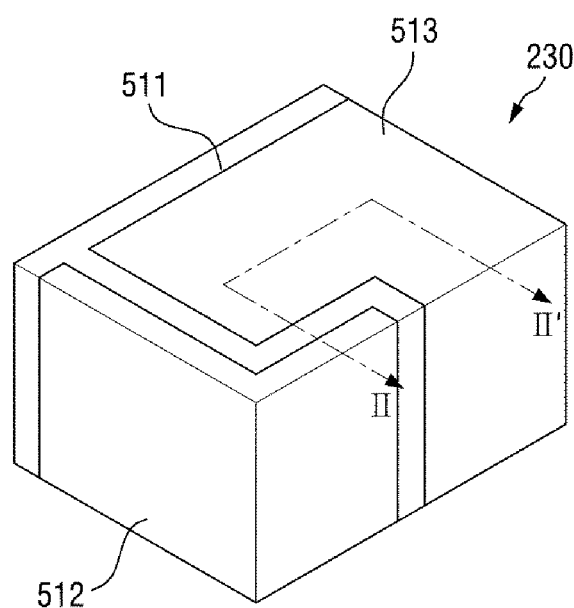
FIG. 14 is a perspective view of an embodiment of the third sound generator of FIG. 4.
Figure 15:
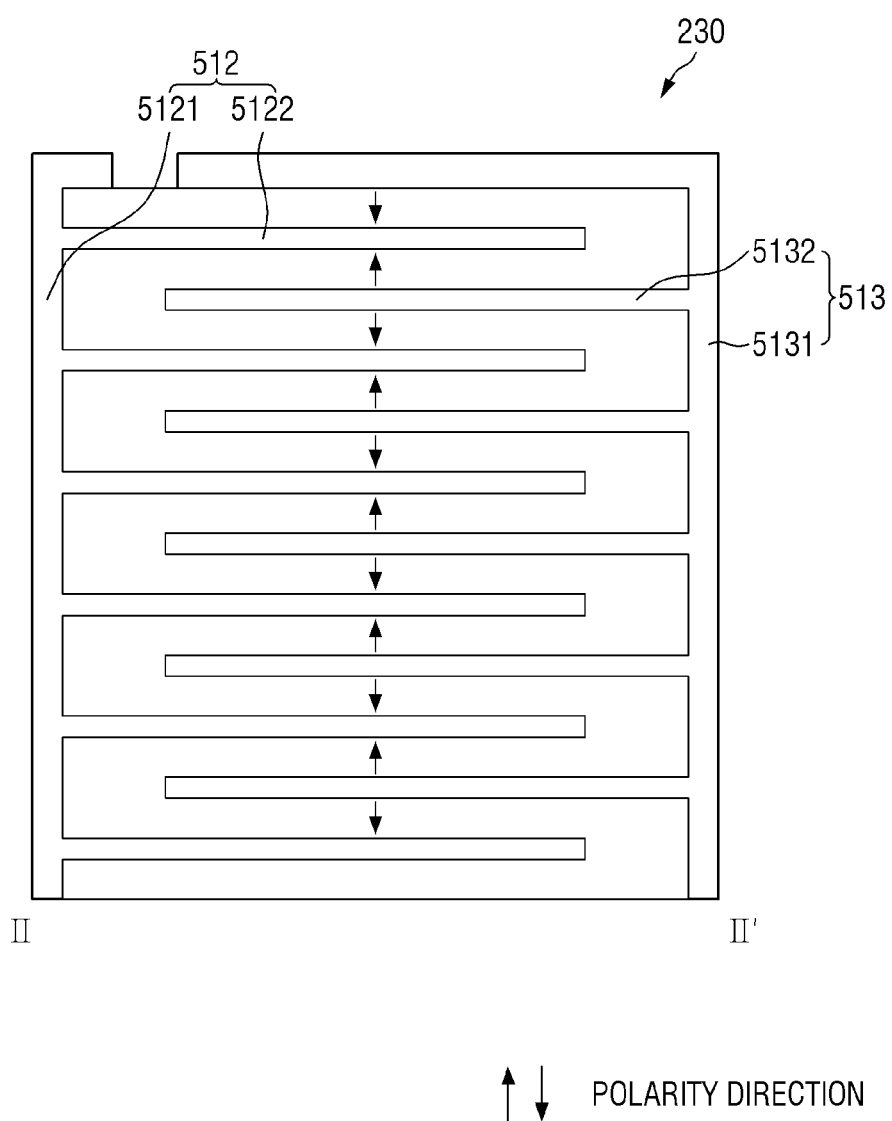
FIG. 15 is a cross-sectional view taken along line of FIG. 14.

FIG. 14 is a perspective view of an embodiment of the third sound generator 230 and the fourth sound generator 240 of FIG. 4. FIG. 15 is a cross-sectional view taken along line of FIG. 14.

Referring to FIGS. 14 and 15, each of the third sound generator 230 and the fourth sound generator 240 may be a piezoelectric element that vibrates the display panel 110 by contracting or expanding in response to a voltage applied thereto. In such an embodiment, each of the third sound generator 230 and the fourth sound generator 240 may include a vibration layer 511, a first electrode 512, and a second electrode 513.

The first electrode 512 may include a first stem electrode 5121 and first branch electrodes 5122. The first stem electrode 5121 may be disposed on only one side surface of the vibration layer 511 or on a plurality of side surfaces of the vibration layer 511 as illustrated in FIG. 14. The first stem electrode 5121 may also be disposed on an upper surface of the vibration layer 511. The first branch electrodes 5122 may extend or branch from the first stem electrode 5121. The first branch electrodes 5122 may be arranged parallel to each other.

The second electrode 513 may include a second stem electrode 5131 and second branch electrodes 5132. The second stem electrode 5131 may be disposed on another side surface of the vibration layer 511 or may be disposed on a plurality of side surfaces of the vibration layer 511 as illustrated in FIG. 14. Here, as illustrated in FIG. 14, the first stem electrode 5121 may be disposed on any one of the side surfaces on which the second stem electrode 5131 is disposed. The second stem electrode 5131 may be disposed on the upper surface of the vibration layer 511. The first stem electrode 5121 and the second stem electrode 5131 may not overlap each other. The second branch electrodes 5132 may extend or branch from the second stem electrode 5131. The second branch electrodes 5132 may be arranged parallel to each other.

In an embodiment, the first branch electrodes 5122 and the second branch electrodes 5132 may be arranged parallel to each other n the horizontal direction (X-axis direction or Y-axis direction). In such an embodiment, the first branch electrodes 5122 and the second branch electrodes 5132 may be alternately arranged in the vertical direction (Z-axis direction). That is, the first branch electrodes 5122 and the second branch electrodes 5132 may be repeatedly arranged in the vertical direction (Z-axis direction) in the order of the first branch electrode 5122, the second branch electrode 5132, the first branch electrode 5122 and the second branch electrode 5132.

The first electrode 512 and the second electrode 513 may be connected to metal lines or pad electrodes of the first sound circuit board 250 or the second sound circuit board 260. The metal lines or pad electrodes of the first sound circuit board 250 or the second sound circuit board 260 may be connected to the first electrode 512 and the second electrode 513 disposed on the surface of the third sound generator 230 or the fourth sound generator 240.

The vibration layer 511 may be a piezoelectric element that is deformed according to a first driving voltage applied to the first electrode 512 and a second driving voltage applied to the second electrode 513. In such an embodiment, the vibration layer 511 may include a piezoelectric material such as a polyvinylidene fluoride ("PVDF") film or plumbum ziconate titanate ("PZT") and an electroactive polymer.

Since the production temperature of the vibration layer 511 is high, the first electrode 512 and the second electrode 513 may include or be made of silver (Ag) having a high melting point or an alloy of Ag and palladium (Pd). In an embodiment, where the first electrode 512 and the second electrode 513 include or are made of an alloy of Ag and Pd, the content of Ag may be higher than that of Pd to increase the melting points of the first electrode 512 and the second electrode 513.

The vibration layer 511 may be disposed between the first branch electrodes 5122 and the second branch electrodes 5132. The vibration layer 511 contracts or expands based on the difference between the first driving voltage applied to a first branch electrode 5122 and the second driving voltage applied to a second branch electrode 5132.

In an embodiment, as illustrated in FIG. 15, the polarity direction of the vibration layer 511 disposed between a first branch electrode 5122 and a second branch electrode 5132 disposed under the first branch electrode 5122 may be an upward direction (↑). In such an embodiment, the vibration layer 511 has a positive polarity in an upper area adjacent to the first branch electrode 5122 and a negative polarity in a lower area adjacent to the second branch electrode 5132. In such an embodiment, the polarity direction of the vibration layer 511 disposed between a second branch electrode 5132 and a first branch electrode 5122 disposed under the second branch electrode 5132 may be a downward direction (↓). In such an embodiment, the vibration layer 511 has a negative polarity in an upper area adjacent to the second branch electrode 5132 and a positive polarity in a lower area adjacent to the first branch electrode 5122. The polarity direction of the vibration layer 511 may be determined by a poling process of applying an electric field to the vibration layer 511 using a first branch electrode 5122 and a second branch electrode 5132.

Figure 16:
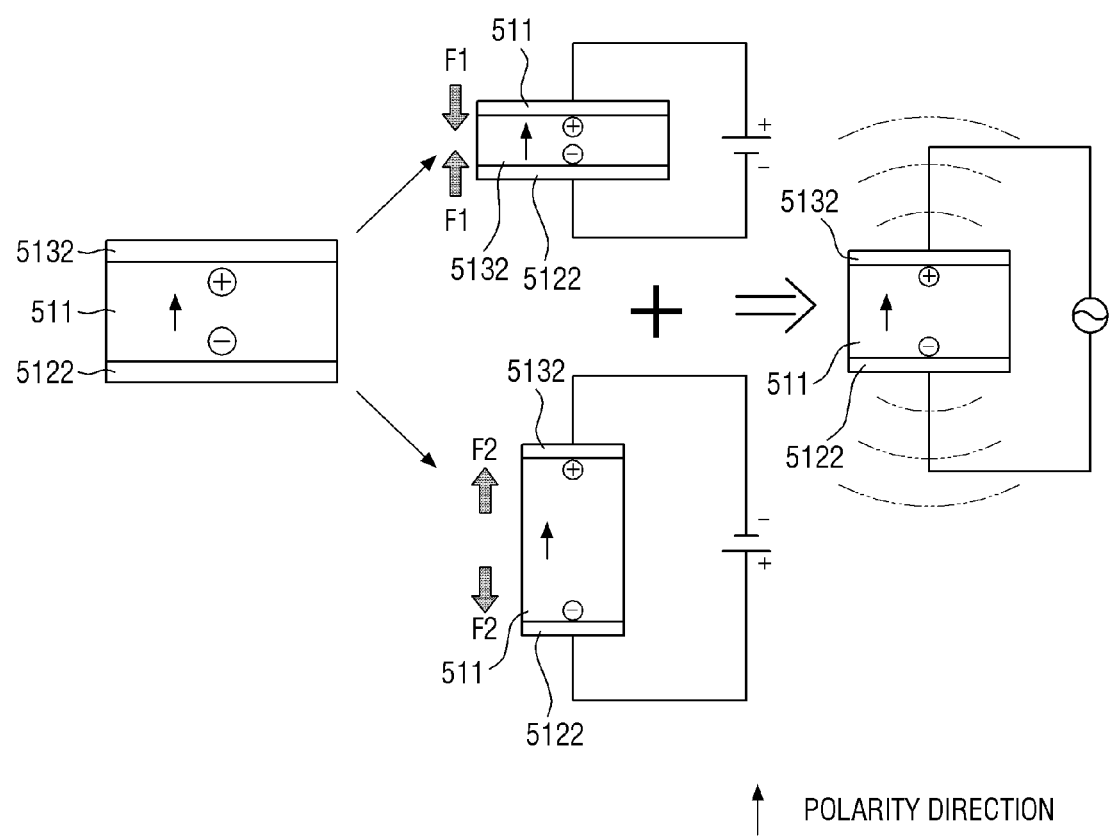
FIG. 16 illustrates an embodiment of a method of vibrating a vibration layer disposed between a first branch electrode and a second branch electrode of the third sound generator.

Referring to FIG. 16, when the $(3A)^{th}$ driving voltage or the $(4A)^{th}$ driving voltage of the positive polarity is applied to the first branch electrode 5122 and the $(3B)^{th}$ driving voltage or the $(4B)^{th}$ driving voltage of the negative polarity is applied to the second branch electrode 5132, the polarity direction of the vibration layer 511 disposed between a first branch electrode 5122 and a second branch electrode 5132 disposed under the first branch electrode 5122 is the upward direction (↑) such that the vibration layer 511 may contract according to a first force F1. The first force F1 may be a compressive force. In such an embodiment, when the $(3A)^{th}$ driving voltage or the $(4A)^{th}$ driving voltage of the negative polarity is applied to the first branch electrode 5122 and the $(3B)^{th}$ driving voltage or the $(4B)^{th}$ driving voltage of the positive polarity is applied to the second branch electrode 5132, the vibration layer 511 may expand according to a second force F2. The second force F2 may be a tensile force.

In an embodiment, referring to FIG. 16, the $(3A)^{th}$ driving voltage or the $(4A)^{th}$ driving voltage of the positive polarity is applied to the second branch electrode 5132 and the $(3B)^{th}$ driving voltage or the $(4B)^{th}$ driving voltage of the negative polarity is applied to the first branch electrode 5122, the polarity direction of the vibration layer 511 disposed between a second branch electrode 5132 and a first branch electrode 5122 disposed under the second branch electrode 5132 is the downward direction (↓), such that the vibration layer 511 may expand according to a tensile force. In such an embodiment, when the $(3A)^{th}$ driving voltage or the $(4A)^{th}$ driving voltage of the negative polarity is applied to the second branch electrode 5132 and the $(3B)^{th}$ driving voltage or the $(4B)^{th}$ driving voltage of the positive polarity is applied to the first branch electrode 5122, the vibration layer 511 may contract according to a compressive force. The second force F2 may be a tensile force.

According to an embodiment as illustrated in FIGS. 14 and 15, when the $(3A)^{th}$ driving voltage or the $(4A)^{th}$ driving voltage applied to the first electrode 512 and the $(3B)^{th}$ driving voltage or the $(4B)^{th}$ driving voltage applied to the second electrode 513 repeatedly alternate between the positive polarity and the negative polarity, the vibration layer 511 may repeatedly contact and expand, thereby causing the third sound generator 230 and the fourth sound generator 240 to vibrate.

Figure 17A:
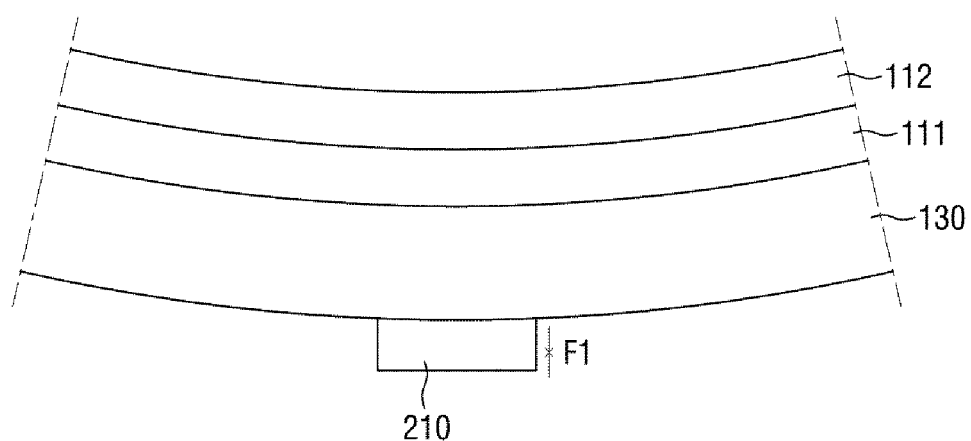
FIGS. 17A and 17B are side views illustrating a vibration of the display panel by the vibration of the third sound generator illustrated in FIGS. 14 and 15.
Figure 17B:
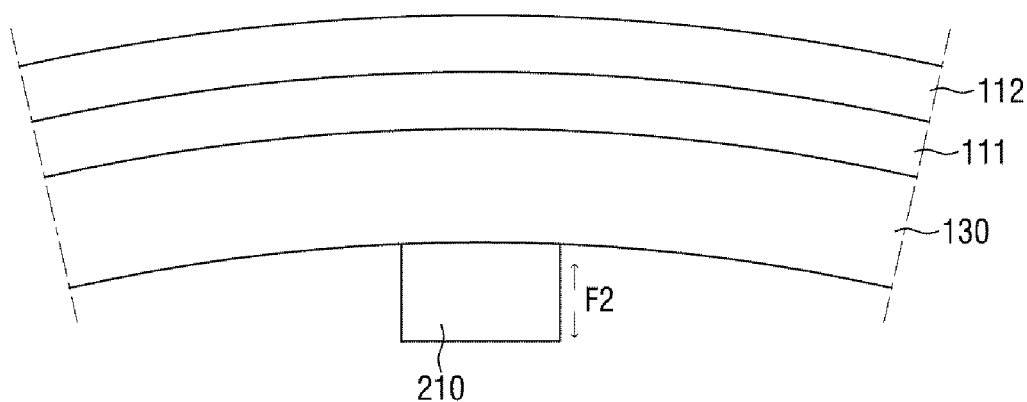

In an embodiment, each of the third sound generator 230 and the fourth sound generator 240 is disposed on the lower surface of the display panel 110, the display panel 110 may vibrate up and down due to stress, as illustrated in FIGS. 17A and 17B when the vibration layer 511 of each of the third sound generator 230 and the fourth sound generator 240 contracts and expands. Accordingly, the display panel 110 is vibrated by each of the third sound generator 230 and the fourth sound generator 240, such that the display device 10 may output a sound.

Figure 18:
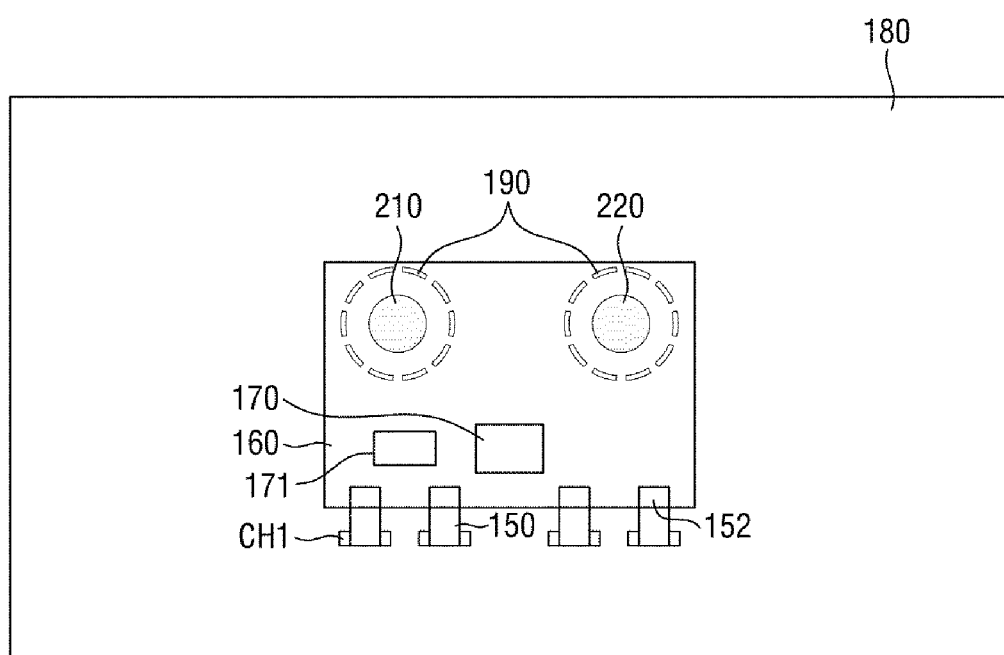
FIG. 18 is a bottom view of an embodiment of the display device according to the invention.
Figure 18:
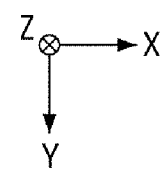

FIG. 18 is a bottom view of an embodiment of the display device 10 of FIG. 2.

The embodiment of FIG. 18 is substantially the same as the embodiment of FIG. 3 except that a first buffer ember 190 surrounds each of a first sound generator 210 and a second sound generator 220 but is not formed continuously.

Figure 19:
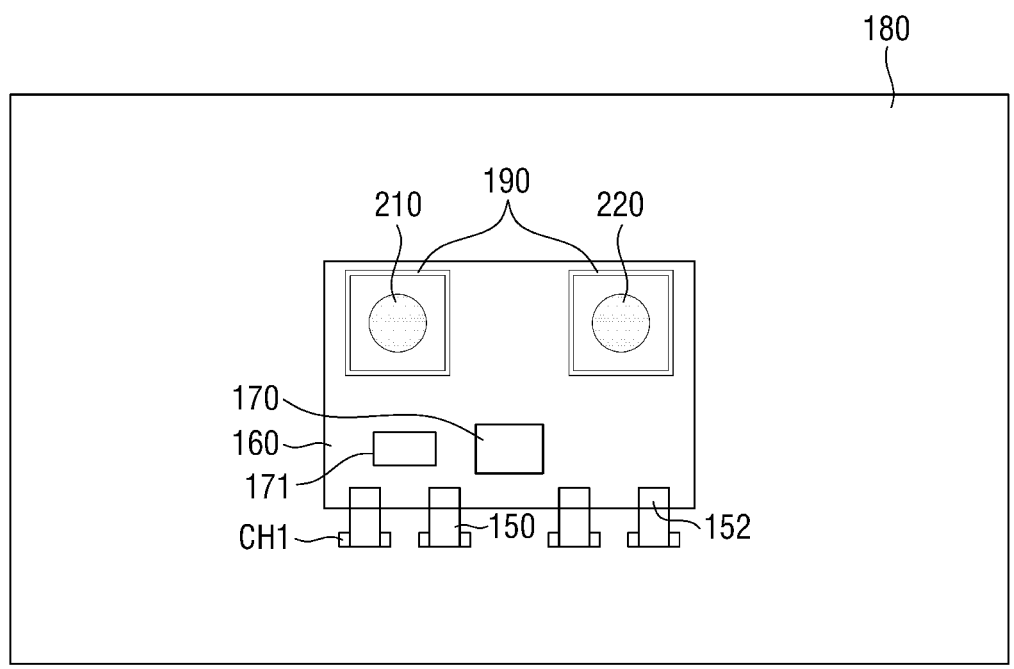
FIG. 19 is a bottom view of an alternative embodiment of the display device according to the invention.
Figure 19:
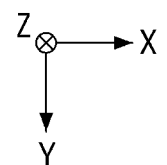

FIG. 19 is a bottom view of an alternative embodiment of the display device 10 of FIG. 2.

The embodiment of FIG. 19 is substantially the same as the embodiment of FIG. 3 except that a first buffer member 190 surrounds each of a first sound generator 210 and a second sound generator 220 in a square shape when seen in a plan view. The shape in which the first buffer member 190 is disposed when seen in a plan view is not limited to the circular shape illustrated in FIG. 3 and the square shape illustrated in FIG. 19. In one embodiment, for example, the shape in which the first buffer member 190 is disposed when seen in a plan view may be an elliptical shape or a polygonal shape other than the square shape.

Figure 20:
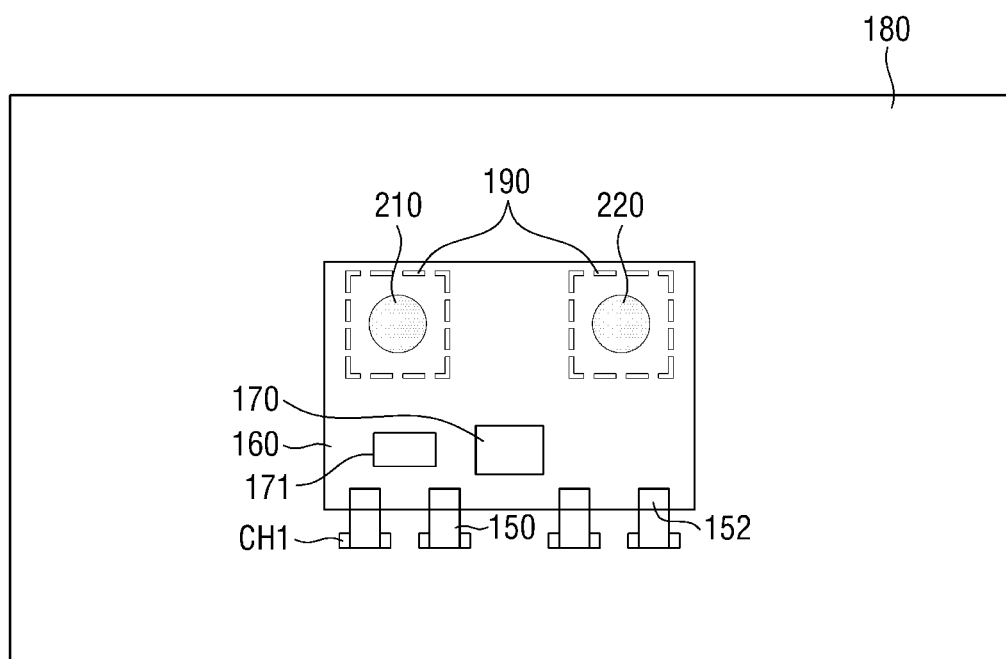
FIG. 20 is a bottom view of another alternative embodiment of the display device according to the invention.
Figure 20:
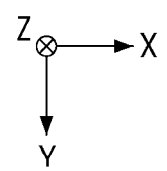

FIG. 20 is a bottom view of another alternative embodiment of the display device 10 of FIG. 2.

The embodiment of FIG. 20 is substantially the same as the embodiment of FIG. 19 except that a first buffer member 190 surrounds each of a first sound generator 210 and a second sound generator 220 in a square shape when seen in a plan view but is not formed continuously.

Figure 21:
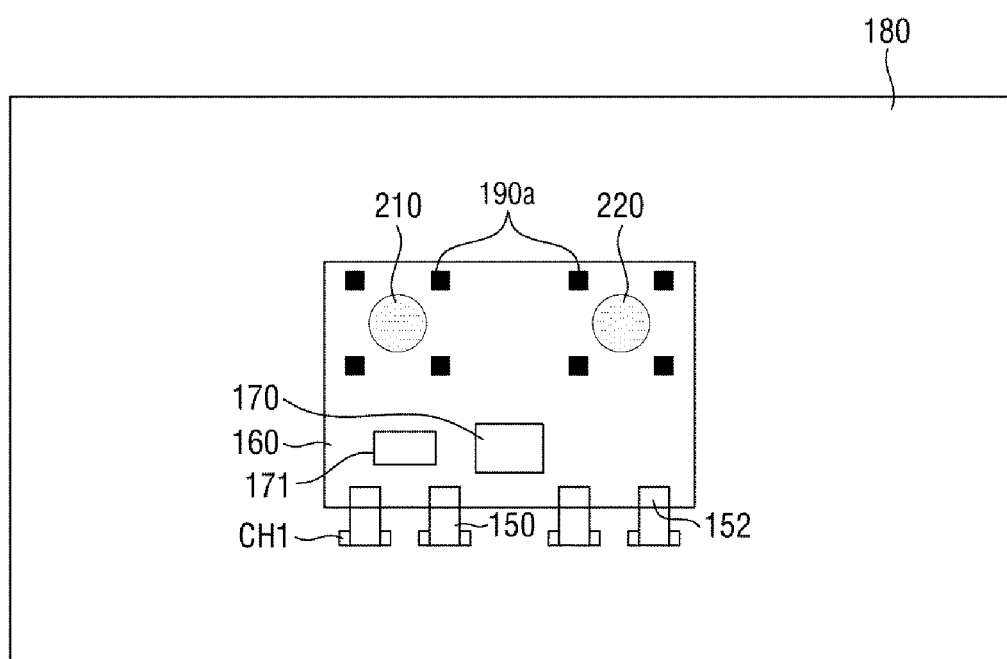
FIG. 21 is a bottom view of another alternative embodiment of the display device according to the invention.

FIG. 21 is a bottom view of another alternative embodiment of the display device 10 of FIG. 2.

The embodiment of FIG. 21 is substantially the same as the embodiment of FIG. 3 except that first buffer members 190a are disposed adjacent to each of a first sound generator 210 and a second sound generator 220 when seen in a plan view.

Referring to FIG. 21, each of the first buffer members 190a may be formed as or in a shape of a square dot when seen in a plan view. When seen in a plan view, the first buffer members 190a may be disposed on upper left, upper right, lower left and lower right sides of each of the first sound generator 210 and the second sound generator 220. Here, a distance between the first sound generator 210 and the first buffer member 190a disposed on the upper left side of the first sound generator 210, a distance between the first sound generator 210 and the first buffer member 190a disposed on the upper right side of the first sound generator 210, a distance between the first sound generator 210 and the first buffer member 190a disposed on the lower left side of the first sound generator 210, and a distance between the first sound generator 210 and the first buffer member 190a disposed on the lower right side of the first sound generator 210 may be, but are not limited to, substantially the same as each other.

In such an embodiment, as shown in FIG. 21, four first buffer members 190a are disposed adjacent to each of the first sound generator 210 and the second sound generator 220, but the number of the first buffer members 190a disposed adjacent to each of the first sound generator 210 and the second sound generator 220 is not limited to four and may also be two or more.

Figure 22:
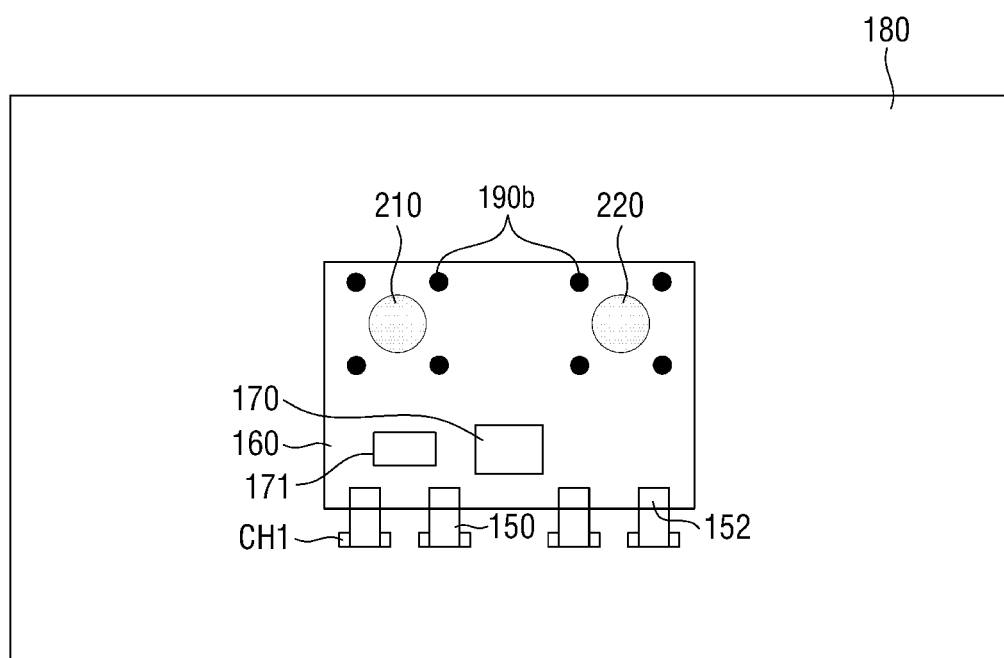
FIG. 22 is a bottom view of another alternative embodiment of the display device according to the invention.
Figure 22:
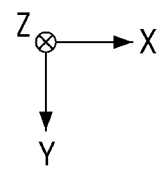

FIG. 22 is a bottom surface of another alternative embodiment of the display device 10 of FIG. 2.

The embodiment of FIG. 22 is substantially the same as the embodiment of FIG. 21 except that each of first buffer members 190b is in a shape of or formed as a circular dot.

However, the shape of each of the first buffer members 190b is not limited to a square dot illustrated in FIG. 21 or a circular dot illustrated in FIG. 22. In one embodiment, for example, the shape of each of the first buffer members 190*b* may also be an elliptical dot or a polygonal dot other than a square dot.

In an embodiment, as shown in FIGS. 21 and 22, all of the first buffer members 190*b* have the same shape as each other, but the disclosure is not limited thereto. Alternatively, all of the first buffer members 190*b* may also have different shapes. Alternatively, at least two of the first buffer members 190*b* may have different shapes.

Figure 23:
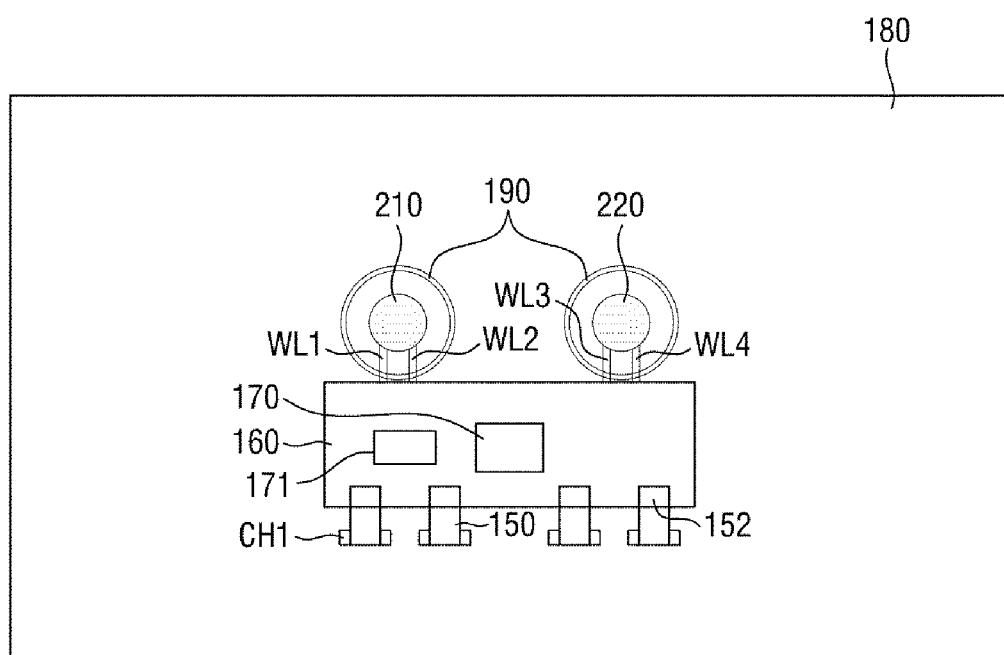
FIG. 23 is a bottom view of another alternative embodiment of the display device according to the invention.
Figure 24:
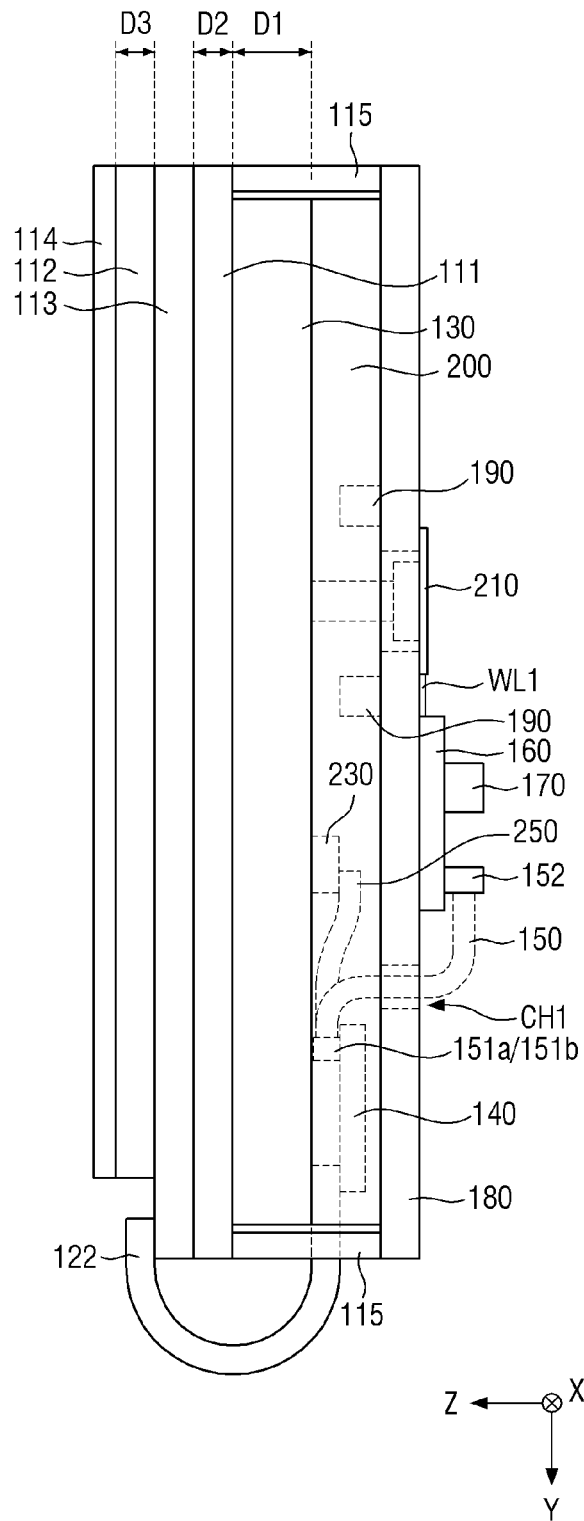
FIG. 24 is a side view of the display device of FIG. 23.
Figure 25:
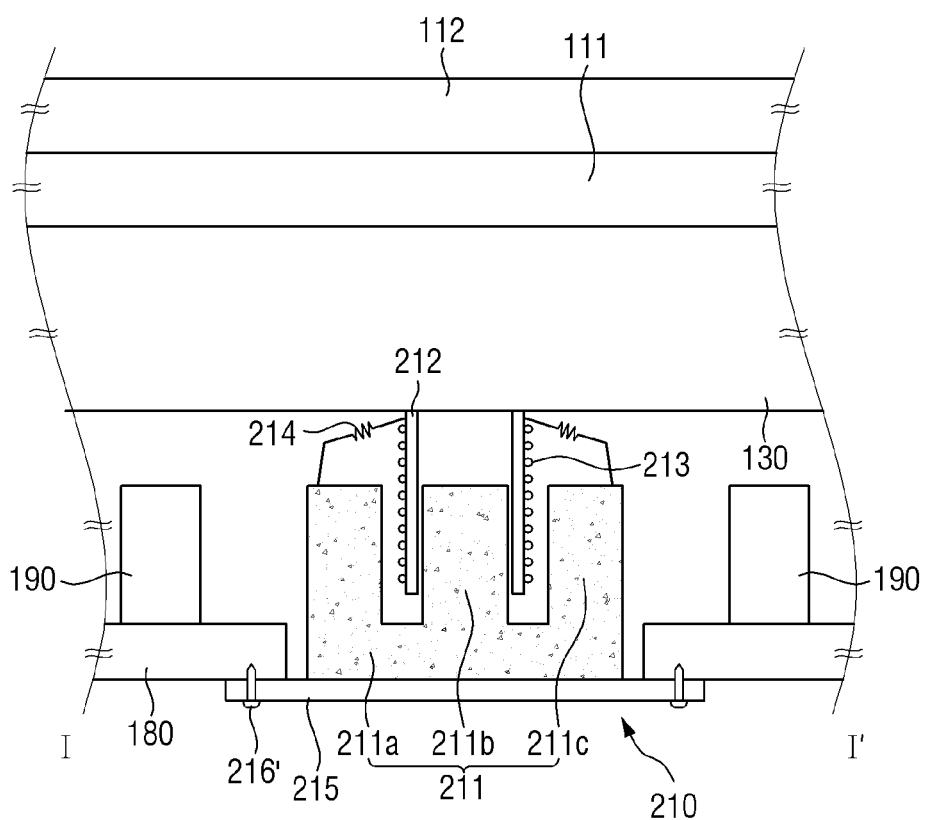
FIG. 25 is a cross-sectional view taken along line IV-IV' of FIG. 23.

FIG. 23 is a bottom view of another alternative embodiment of the display device 10 of FIG. 2. FIG. 24 is a side view of the display device 10 of FIG. 26. FIG. 25 is a cross-sectional view take along line IV-IV' of FIG. 23.

The embodiment of FIGS. 23 through 25 is substantially the same as the embodiment of FIGS. 3, 5 and 8 except that a first sound generator 210 and a second sound generator 220 are not fixed to a control circuit board 160, but are fixed to a lower cover 180.

Referring to FIGS. 23 through 25, in an embodiment where the first sound generator 210 and the second sound generator 220 are disposed not on the control circuit board 160 but on the lower cover 180, the first sound generator 210 and the second sound generator 220 may be fixed to the lower cover 180. In such an embodiment, a lower plate 215 of each of the first sound generator 210 and the second sound generator 220 may be fixed to the lower cover 180 by a fixing member 216' such as a screw. Accordingly, a magnet 211 of each of the first sound generator 210 and the second sound generator 220 may be fixed to the lower cover 180. In such an embodiment, the first buffer member 190 may be disposed on a second surface of the lower cover 180, not on a second surface of the control circuit board 160.

The first sound generator 210 may be electrically connected to the control circuit board 160 by a first sound signal line WL1 and a second sound signal line WL2. In an embodiment, an end of the first sound signal line WL1 may be connected to an end of a voice coil 213 of the first sound generator 210, and an end of the second signal line WL2 may be connected to the other end of the voice coil 213 of the first sound generator 210. The other end of the first sound signal line WL1 and the other end of the second sound signal line WL2 may be connected to metal lines of the control circuit board 160. In such an embodiment, the first sound generator 210 may receive a $(1A)^{th}$ driving voltage of a first sound signal of a sound driving circuit 171 through the first sound signal line WL1 and may receive a $(1B)^{th}$ driving voltage of the first sound signal of the sound driving circuit 171 through the second sound signal line WL2. The first sound generator 210 may output sound by vibrating a display panel 110 in response to the $(1A)^{th}$ driving voltage and the $(1B)^{th}$ driving voltage.

The second sound generator 220 may be electrically connected to the control circuit board 160 by a third sound signal line WL3 and a fourth sound signal line WL4. In an embodiment, an end of the third sound signal line WL3 may be connected to an end of a voice coil 213 of the second sound generator 220, and an end of the fourth signal line WL4 may be connected to the other end of the voice coil 213 of the second sound generator 220. The other end of the third sound signal line WL3 and the other end of the fourth sound signal line WL4 may be connected to metal lines of the control circuit board 160. In such an embodiment, the second sound generator 220 may receive a $(2A)^{th}$ driving voltage of a second sound signal of the sound driving circuit 171 through the third sound signal line WL3 and may receive a $(2B)^{th}$ driving voltage of the second sound signal of the sound driving circuit 171 through the fourth sound signal line WL4. The second sound generator 220 may output sound by vibrating the display panel 110 in response to the $(2A)^{th}$ driving voltage and the $(2B)^{th}$ driving voltage.

Figure 26:
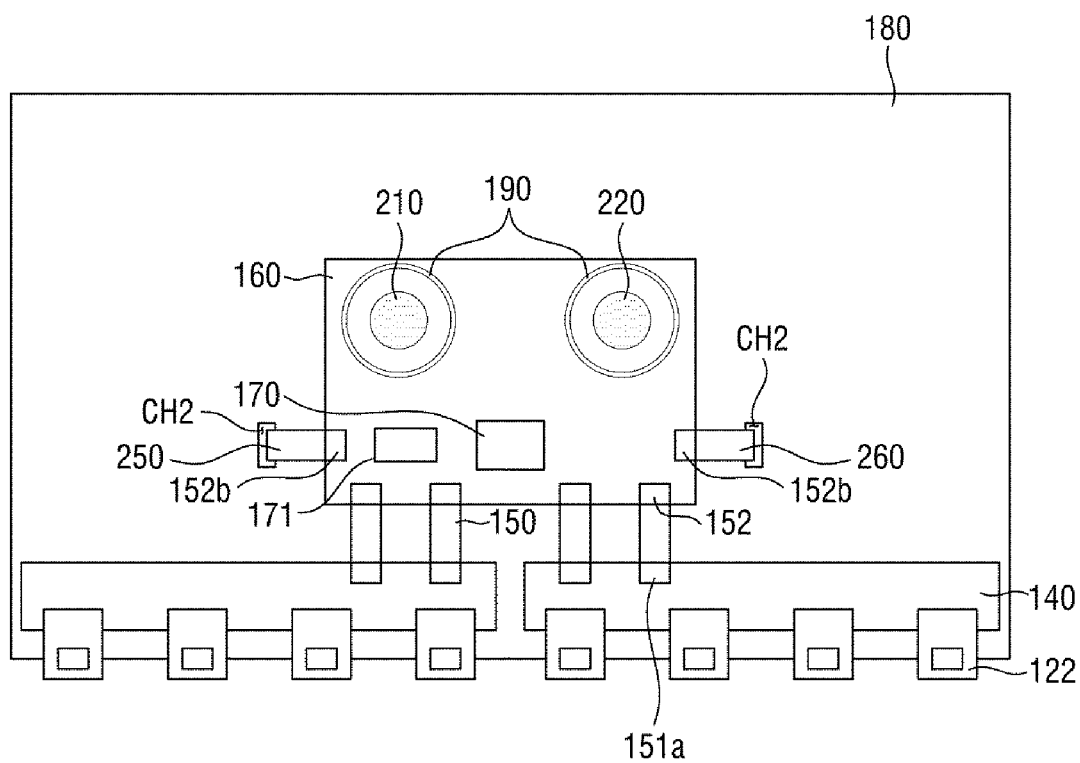
FIG. 26 is a bottom view of an alternative embodiment of the display device according to the invention.
Figure 27:
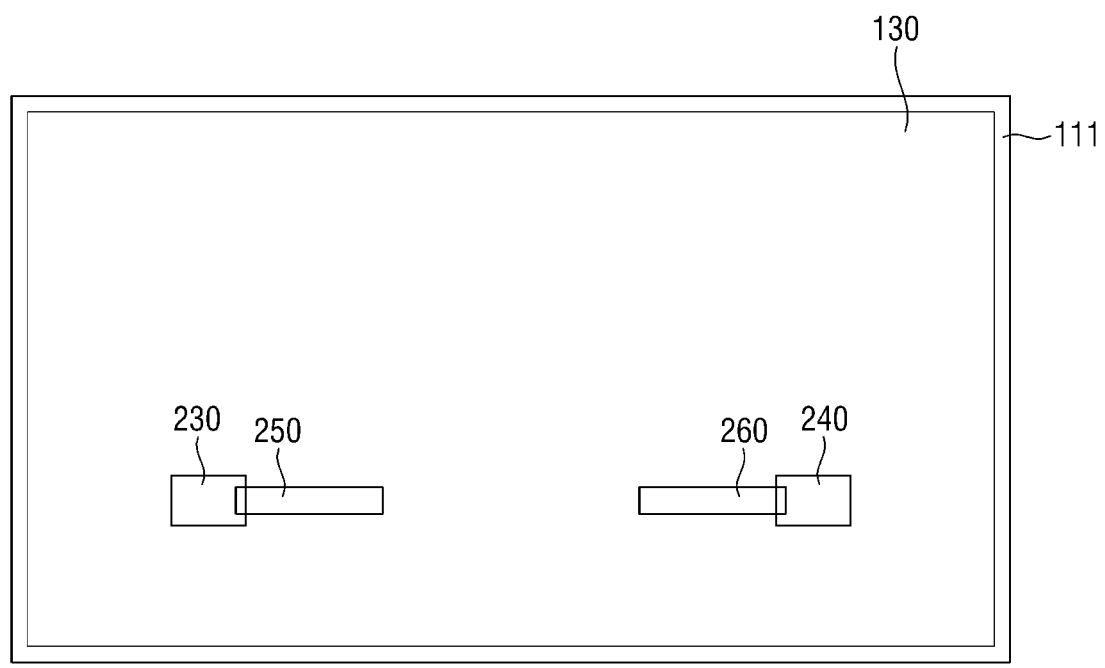
FIG. 27 is a bottom view of an embodiment of the display device of FIG. 26 when a lower cover and a control circuit board are omitted.
Figure 27:
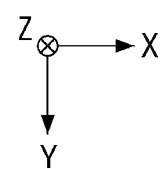
Figure 28:
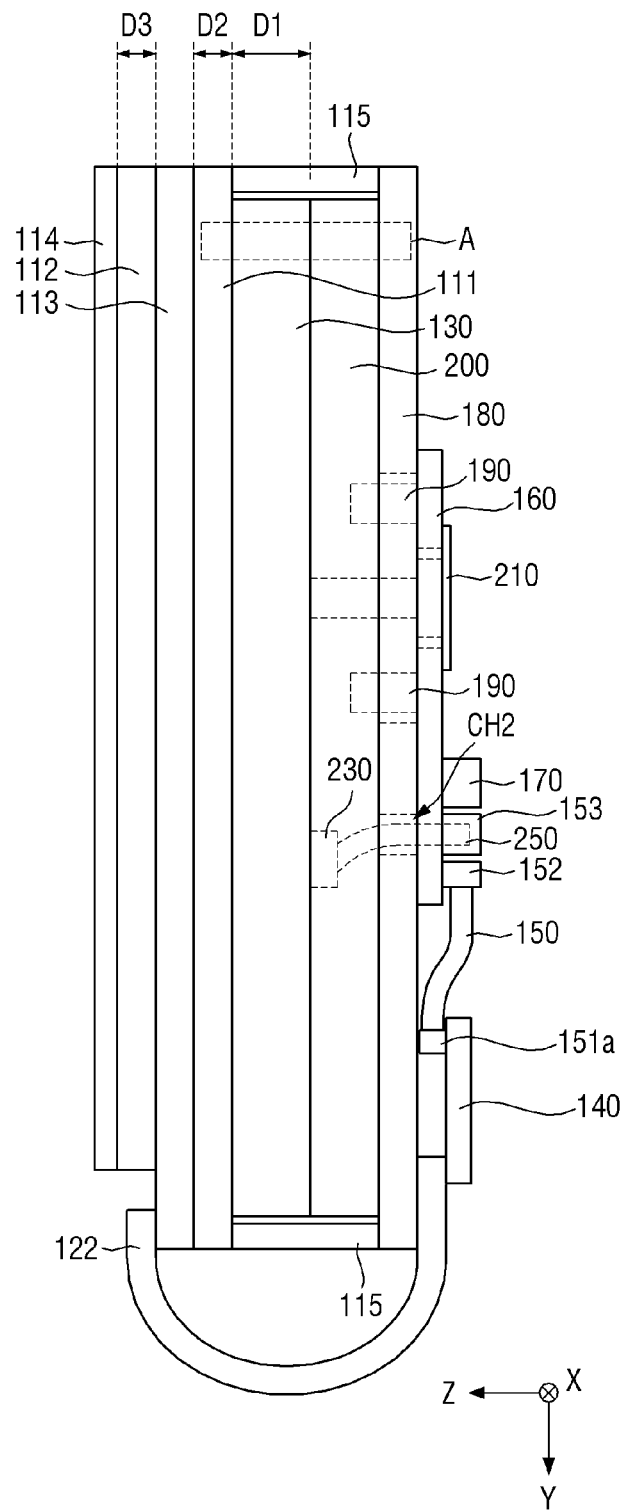
FIG. 28 is a side view of the display device of FIG. 26.

FIG. 26 is a bottom view of another alternative embodiment of the display device 10 of FIG. 2. FIG. 27 is a bottom view of an embodiment of the display device 10 of FIG. 26 when a lower cover 180 and a control circuit board 160 are omitted from FIG. 26. FIG. 28 is a side view of the display device 10 of FIG. 26.

The embodiment of FIGS. 26 through 28 is substantially the same as the embodiment of FIGS. 3 through 5 except that flexible films 122 are bent toward a lower surface of the lower cover 180 and that source circuit boards 140 and the control circuit board 160 are disposed on a first surface of the lower cover 180.

Referring to FIGS. 26 through 28, in an embodiment, the flexible films 122 may be bent toward the lower surface of the lower cover 180. Accordingly, the source circuit boards 140 and the control circuit board 160 may be disposed on the first surface of the lower cover 180. Therefore, cables 150 connecting the source circuit boards 140 and the control circuit board 160 may pass through first cable holes CH1 defined through the lower cover 180.

A first sound circuit board 250 connected to a third sound generator 230 may be connected to a connector 153 of the control circuit board 160 through a second cable hole CH2 defined through the lower cover 180.

A second sound circuit board 260 connected to a fourth sound generator 240 may also be connected to another connector of the control circuit board 160 through another second cable hole CH2 defined through the lower cover 180.

Figure 29:
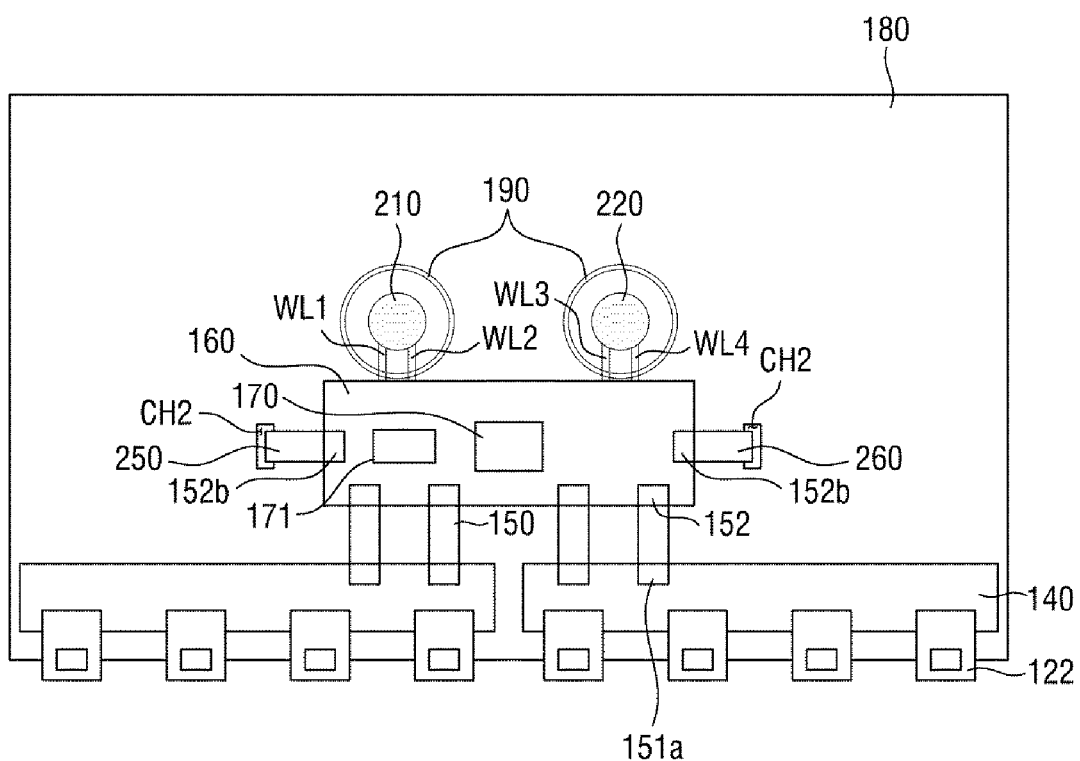
FIG. 29 is a bottom view of another alternative embodiment of the display device according to the invention.
Figure 30:
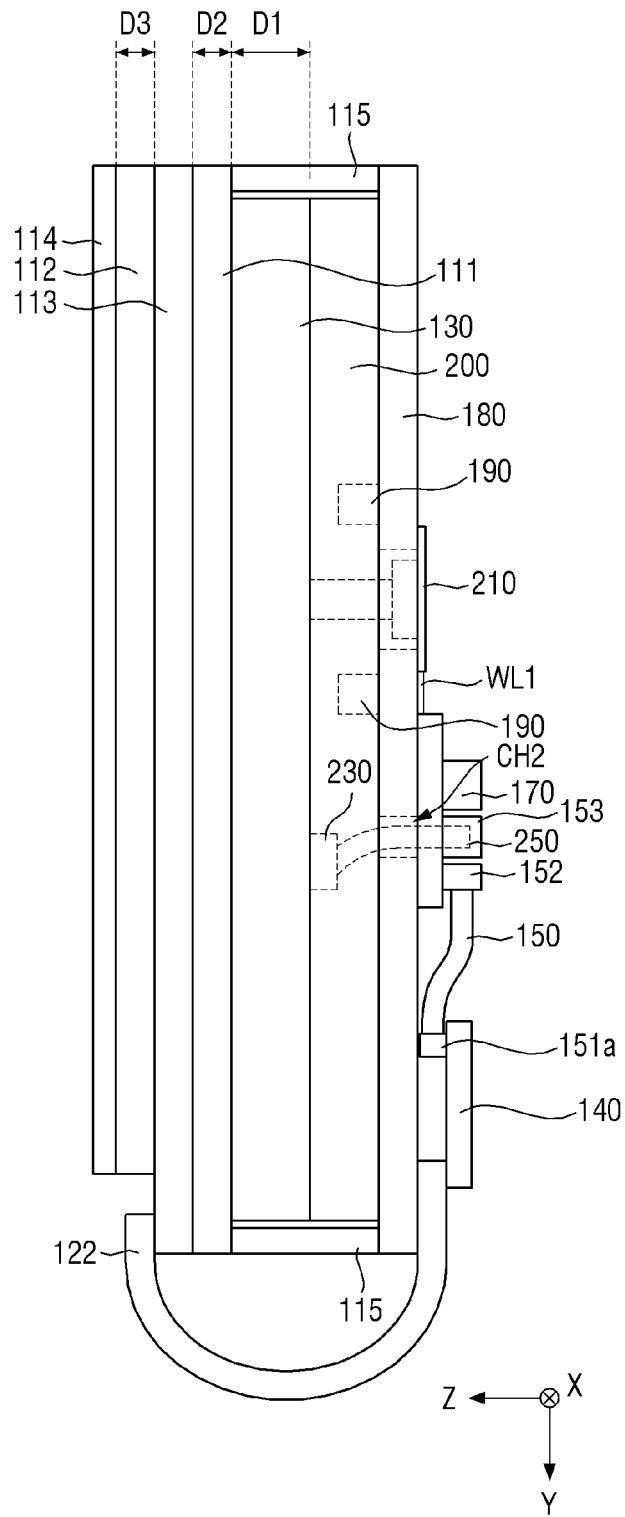
FIG. 30 is a side view of the display device of FIG. 29.

FIG. 29 is a bottom view of another alternative embodiment of the display device 10 of FIG. 2. FIG. 30 is a side view of the display device 10 of FIG. 29.

The embodiment of FIGS. 29 and 30 is substantially the same as the embodiment of FIGS. 3 and 5 except that a first sound generator 210 and a second sound generator 220 are not fixed to a control circuit board 160, but are fixed to a lower cover 180. In addition, the embodiment of FIGS. 29 and 30 is different from the embodiment of FIGS. 3 and 5 in that flexible films 122 are bent toward a lower surface of the lower cover 180 and that source circuit boards 140 are disposed on a first surface of the lower cover 180.

The embodiment of FIGS. 29 and 30 is substantially the same as the embodiment of FIGS. 23 through 25 in that the first sound generator 210 and the second sound generator 220 are not fixed to the control circuit board 160, but are fixed to the lower cover 180. In addition, the embodiment of FIGS. 29 and 30 is substantially the same as the embodiment of FIGS. 26 through 28 in that the flexible films 122 are bent toward the lower surface of the lower cover 180 and that the source circuit boards 140 are disposed on the first surface of the lower cover 180. Therefore, any repetitive detailed description of such elements of FIGS. 29 and 30 will be omitted.

In embodiments of the invention, a display device outputs sound using a display panel as a diaphragm through a sound generator. Therefore, since sound may be output from the front of the display device, sound quality may be improved. In such embodiments, the sound generator allows a speaker typically disposed on a lower surface or a side of a conventional display panel to be omitted.

In embodiments of a display device, a buffer member is attached to a second surface of a circuit board or a lower cover. Therefore, when a display panel is vibrated by a sound generator, the display panel may be effectively prevented from colliding with the lower cover and being damaged.

In embodiments of a display device, a sound generator and a source circuit board are connected by a sound circuit board. Therefore, even if the sound generator is disposed on a surface of a heat dissipation film and a control circuit board is disposed on a surface of a lower cover, the control circuit board and the sound generator may be easily electrically connected to each other.

In embodiments of a display device, each sound generator is surrounded by a blocking member. Therefore, the effect of vibrations of a display panel generated by each sound generator on vibrations of the display panel generated by an adjacent sound generator may be effectively prevented or substantially reduced.

However, the effects of the embodiments are not restricted to the one set forth herein. The above and other effects of the embodiments will become more apparent to one of daily skill in the art to which the embodiments pertain by referencing the claims.

While the inventions have been particularly shown and described with reference to some embodiments thereof, it will be understood by one of ordinary skill in the art that various changes in form and detail may be made therein without departing from the spirit and scope of the invention as defined by the following claims.

What is claimed is:

1. A display device comprising:
a display panel including a light emitting device layer disposed on a first surface of a substrate and configured to emit light;
a lower cover disposed on a second surface opposite to the first surface of the substrate;
a first sound generator connected to the display panel and the lower cover, and configured to vibrate the display panel to output sound; and
a first buffer member disposed on the second surface of the substrate,
wherein a height of the first buffer member is less than a gap between the substrate and the lower cover, and
wherein a length of the first buffer member in a thickness direction of the substrate is less than a length of the first sound generator in the thickness direction of the substrate.

2. The display device of claim 1, wherein the first buffer member is attached to a first surface of the lower cover facing the second surface of the substrate.

3. The display device of claim 1, wherein the first buffer member is attached to the second surface of the substrate.

4. The display device of claim 1, wherein the lower cover includes a first hole overlapping the first sound generator.

5. The display device of claim 1, further comprising: a blocking member between the substrate and the lower cover,
wherein a height of the blocking member is greater than a height of the first buffer member.

6. The display device of claim 1, wherein the first sound generator includes:
a bobbin disposed on one surface of the substrate;
a voice coil surrounding the bobbin;
a magnet spaced apart from the bobbin; and
a lower plate disposed on the magnet and combined with the lower cover by a fixing member.

7. The display device of claim 4, further comprising a second sound generator disposed on the first surface of the substrate,
wherein the second sound generator includes:
a first electrode to which a first driving voltage is applied;
a second electrode to which a second driving voltage is applied; And
a vibration layer between the first electrode and the second electrode and having a piezoelectric element that contracts or expands according to a first driving voltage applied to the first electrode and a second driving voltage applied to the second electrode.

8. A display device comprising:
a display panel including a light emitting device layer disposed on a first surface of a substrate and configured to emit light;
a lower cover disposed on a second surface opposite to the first surface of the substrate;
a first sound generator connected to the display panel and the lower cover, and configured to vibrate the display panel to output sound;
a first buffer member disposed on the second surface of the substrate; and
a sound circuit board connected to a second sound generator,
wherein the lower cover includes a first hole overlapping the first sound generator, and a second hole penetrating the lower cover, and
wherein the sound circuit board is disposed in the second hole, and
wherein the size of the first hole is greater than the size of the second hole.

9. The display device of claim 8, further comprising:
the second sound generator disposed on the first surface of the substrate;
a circuit board disposed on a second surface opposite to a first surface of the lower cover; and
a sound driving circuit disposed on a first surface of the circuit board, and configured to output a sound signal to the second sound generator,
wherein the sound circuit board is electrically connected to the sound driving circuit.

10. The display device of claim 9, further comprising a timing control circuit disposed on the circuit board and configured to control a driving timing of the display panel.

11. The display device of claim 9, further comprising a source circuit board disposed on a second surface of the lower cover opposite to the first surface of the lower cover; and
a cable disposed on the second surface of the lower cover and connecting the circuit board and the source circuit board.

12. The display device of claim 1, further comprising an adhesive member attached to an edge of the lower cover.

13. The display device of claim 12, wherein the adhesive member is attached to the other surface of the substrate.

14. The display device of claim 12, wherein the adhesive member is apart from the buffer member.

15. A display device comprising:
a display panel including a light emitting device layer disposed on a first surface of a substrate and configured to emit light;
a circuit board disposed on a second surface opposite to the first surface of the substrate;
a first sound generator connected to the display panel and the circuit board and configured to vibrate the display panel to output sound; and
a buffer member disposed on a first surface of the circuit board facing the second surface of the substrate, wherein a height of the buffer member is less than a gap between the substrate and the lower cover.

16. The display device of claim 15, further comprising:
a timing control circuit disposed on the second surface opposite to the first surface of the circuit board and configured to control a driving timing of the display panel; and
a sound driving circuit disposed on the second surface of the circuit board and configured to output a first sound signal to the first sound generator.

17. The display device of claim 16, further comprising:
a lower cover disposed on the second surface of the substrate; and
a fixing member fixing the circuit board to the lower cover.

18. The display device of claim 17, wherein a distance between the substrate and the lower cover is less than a distance between the substrate and the circuit board.

19. The display device of claim 17, further comprising:
a source circuit board disposed on the second surface of the substrate; and
a cable connecting the circuit board and the source circuit board.

20. The display device of claim 19, wherein the lower cover includes a first hole overlapping the first sound generator and a second hole through which the cable passes,
wherein the size of the first hole is greater than the size of the second hole.

* * * * *